(12) United States Patent
Purayath et al.

(10) Patent No.: US 8,822,288 B2
(45) Date of Patent: Sep. 2, 2014

(54) NAND MEMORY DEVICE CONTAINING NANODOTS AND METHOD OF MAKING THEREOF

(71) Applicant: SanDisk Technologies, Inc., Plano, TX (US)

(72) Inventors: Vinod Purayath, Santa Clara, CA (US); George Samachisa, San Jose, CA (US); George Matamis, Danville, CA (US); James Kai, Santa Clara, CA (US); Yuan Zhang, San Jose, CA (US)

(73) Assignee: Sandisk Technologies Inc., Plano, TX (US)

( * ) Notice: Subject to any disclaimer, the term of this patent is extended or adjusted under 35 U.S.C. 154(b) by 0 days.

(21) Appl. No.: 13/708,587

(22) Filed: Dec. 7, 2012

(65) Prior Publication Data
US 2014/0001533 A1    Jan. 2, 2014

Related U.S. Application Data

(60) Provisional application No. 61/667,007, filed on Jul. 2, 2012.

(51) Int. Cl.
*H01L 29/788* (2006.01)
*H01L 29/792* (2006.01)
*H01L 21/331* (2006.01)
*H01L 29/66* (2006.01)
*H01L 27/115* (2006.01)
*H01L 29/423* (2006.01)

(52) U.S. Cl.
CPC .......... *H01L 29/792* (2013.01); *H01L 29/7881* (2013.01); *H01L 29/788* (2013.01); *H01L 29/66833* (2013.01); *H01L 29/66825* (2013.01); *H01L 27/11524* (2013.01); *H01L 29/42332* (2013.01)

USPC .......... 438/264; 438/761; 438/763; 438/780; 257/321

(58) Field of Classification Search
None
See application file for complete search history.

(56) References Cited

U.S. PATENT DOCUMENTS 5,714,766 A * 2/1998 Chen et al. ...................... 257/17
6,015,738 A   1/2000 Levy et al.
6,297,095 B1 * 10/2001 Muralidhar et al. .......... 438/257

(Continued)

FOREIGN PATENT DOCUMENTS

DE    10 2008 009365 A1    10/2008

OTHER PUBLICATIONS

Haryono, Agus, and Wolfgang H. Binder. "Controlled Arrangement of Nanoparticle Arrays in Block-Copolymer Domains." Small 2.5 (2006): 600-11.*

(Continued)

*Primary Examiner* — Thomas L Dickey
*Assistant Examiner* — Joseph Schoenholtz
(74) *Attorney, Agent, or Firm* — The Marbury Law Group PLLC

(57) ABSTRACT

A method of fabricating a memory device includes providing multiple coatings of nanodots on a tunnel dielectric layer to form a floating gate layer having a high nanodot density. The memory device may have a nanodot-containing floating gate layer with a density greater than $4\times10^{12}$ dots/cm$^2$. Further methods include forming an oxidation barrier layer, such as a silicon nitride shell, over a surface of the nanodots, and depositing a dielectric material over the nanodots to form a floating gate layer.

23 Claims, 13 Drawing Sheets

(56) References Cited

U.S. PATENT DOCUMENTS

| | | | |
|---|---|---|---|
| 6,407,424 B2 | 6/2002 | Forbes | |
| 6,646,302 B2 | 11/2003 | Kan et al. | |
| 6,656,792 B2 | 12/2003 | Choi et al. | |
| 6,859,397 B2 | 2/2005 | Lutze et al. | |
| 6,881,994 B2 | 4/2005 | Lee et al. | |
| 6,913,984 B2 | 7/2005 | Kim et al. | |
| 6,917,542 B2 | 7/2005 | Chen et al. | |
| 6,927,136 B2 | 8/2005 | Lung et al. | |
| 6,991,984 B2 | 1/2006 | Ingersoll et al. | |
| 7,045,851 B2 | 5/2006 | Black et al. | |
| 7,119,395 B2 | 10/2006 | Gutsche et al. | |
| 7,138,680 B2 | 11/2006 | Li et al. | |
| 7,173,304 B2 | 2/2007 | Weimer et al. | |
| 7,259,984 B2 | 8/2007 | Kan et al. | |
| 7,649,779 B2 | 1/2010 | Ruttkowski et al. | |
| 7,723,186 B2 | 5/2010 | Purayath et al. | |
| 8,193,055 B1 | 6/2012 | Purayath et al. | |
| 2004/0026682 A1 | 2/2004 | Jiang | |
| 2004/0130941 A1 | 7/2004 | Kan et al. | |
| 2004/0180491 A1 | 9/2004 | Arai et al. | |
| 2004/0256662 A1 | 12/2004 | Black et al. | |
| 2005/0112820 A1 | 5/2005 | Chen et al. | |
| 2005/0122775 A1 | 6/2005 | Koyanagi et al. | |
| 2005/0258470 A1 | 11/2005 | Lojek et al. | |
| 2005/0287717 A1 | 12/2005 | Heald et al. | |
| 2006/0250836 A1 | 11/2006 | Herner et al. | |
| 2006/0250837 A1 | 11/2006 | Herner et al. | |
| 2007/0045604 A1 | 3/2007 | Liu et al. | |
| 2007/0158736 A1 | 7/2007 | Arai et al. | |
| 2008/0026532 A1* | 1/2008 | Duan et al. | 438/287 |
| 2008/0237692 A1* | 10/2008 | Lee et al. | 257/321 |
| 2008/0242011 A1 | 10/2008 | Song et al. | |
| 2009/0001345 A1 | 1/2009 | Schricker et al. | |
| 2009/0014704 A1 | 1/2009 | Chen et al. | |
| 2009/0027944 A1 | 1/2009 | Ufert | |
| 2009/0097320 A1* | 4/2009 | Min et al. | 365/185.18 |
| 2009/0117697 A1 | 5/2009 | Park et al. | |
| 2009/0134444 A1* | 5/2009 | Hanafi | 257/316 |
| 2009/0146140 A1 | 6/2009 | Kim et al. | |
| 2009/0155967 A1* | 6/2009 | Purayath et al. | 438/261 |
| 2009/0168491 A1 | 7/2009 | Schricker et al. | |
| 2010/0008128 A1 | 1/2010 | Yoshii et al. | |
| 2011/0020992 A1* | 1/2011 | Purayath et al. | 438/259 |
| 2011/0147337 A1* | 6/2011 | Lee | 216/13 |
| 2011/0186799 A1 | 8/2011 | Kai et al. | |
| 2011/0303967 A1* | 12/2011 | Harari et al. | 257/321 |

OTHER PUBLICATIONS

Chan et al., "A True Single-Transistor Oxide—Nitride—Oxide EEPROM Device," IEEE Electron Device Letters, vol. EDL-8, No. 3, Mar. 1987, pp. 93-95.

Nozaki et al., "A 1-Mb EEPROM with MONOS Memory Cell for Semiconductor Disk Application," EEE Journal of Solid-State Circuits, vol. 26, No. 4, Apr. 1991, pp. 497-501.

Chen et al., "Reliability Characteristics of NiSi Nanocrystals Embedded in Oxide and Nitride Layers for Nonvolatile Memory Application," Applied Physics Letters, 92, 152114 (2008).

Jang et al., "Memory Properties of Nickel Silicide Nanocrystal Layer for Possible Application to Nonvolatile Memory Devices," IEEE Transactions on Electron Devices, vol. 56, No. 12, Dec. 2009.

Komatsu et al., "Applying Nanotechnology to Electronics," Science & Technology Trends, Quarterly Review No. 16, Jul. 2005.

Guarini et al., "Low Voltage, Scalable Nanocrystal Flash Memory Fabricated by Templated Self-Assembly," IEEE Int. Electron Devices Meeting Tech. Diges, vol. 22, No. 2, Dec. 2003.

U.S. Appl. No. 13/708,677, V. Purayath et al., "Non-Volatile Memory Structure Containing Nanodots and Continuous Metal Layer Charge Traps and Method of Making Thereof," Specification and drawings, filed Dec. 7, 2012.

U.S. Appl. No. 13/690,054, V. Purayath et al., "Select Gate Formation for Nanodot Flat Cell," Specification and drawings, filed Nov. 30, 2012.

Invitation to Pay Additional Search Fee issued in Application No. PCT/US2013/048883, mailed on Oct. 7, 2013.

Partial International Search Report, International Application No. PCT/US2011/023617, May 24, 2011.

International Preliminary Report on Patentability, International Application No. PCT/US2011/023617, Aug. 16, 2012.

International Search Report & Written Opinion, International Application No. PCT/US2011/023617, Jul. 13, 2011.

Office Action issued Jun. 5, 2014 in U.S. Appl. No. 13/708,677.

* cited by examiner

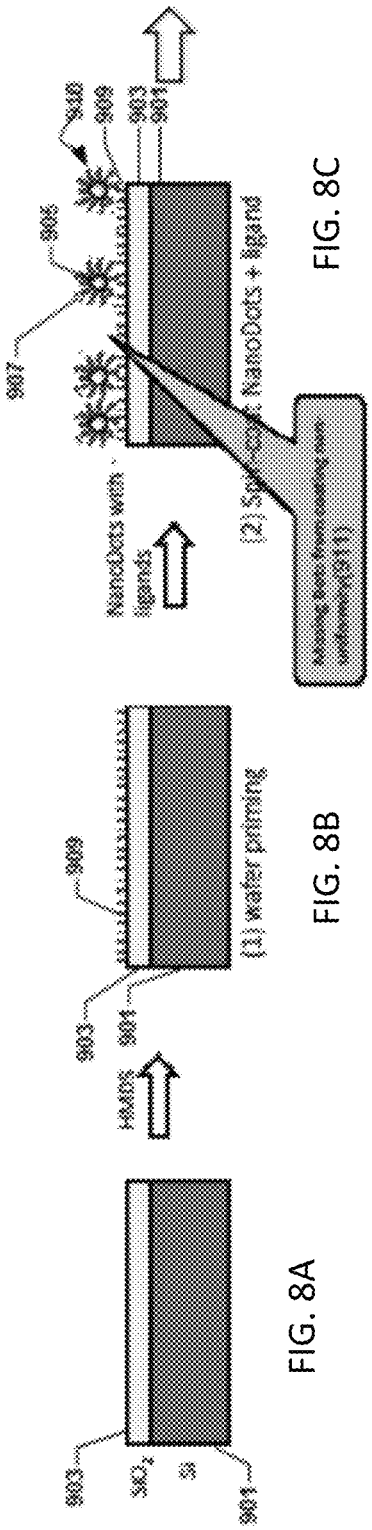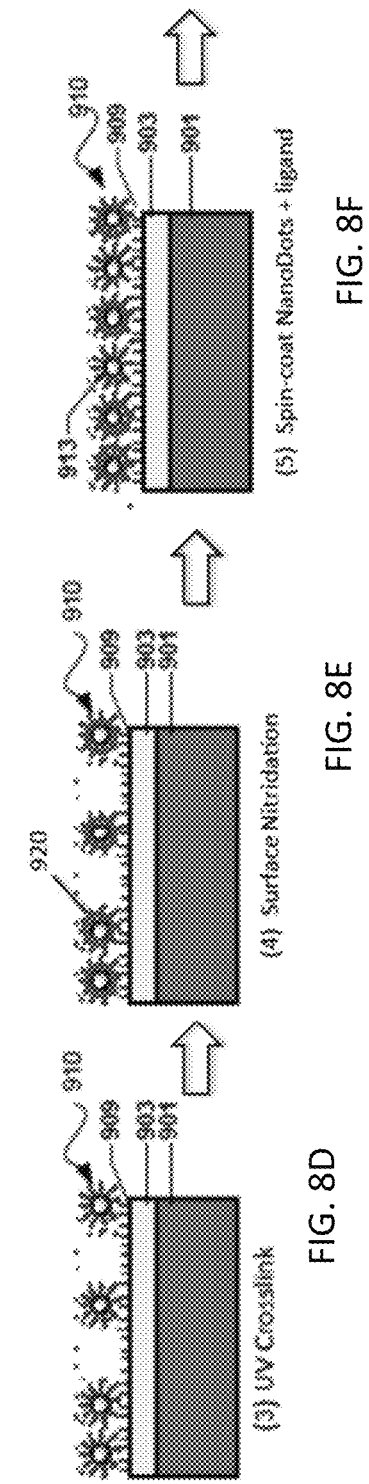

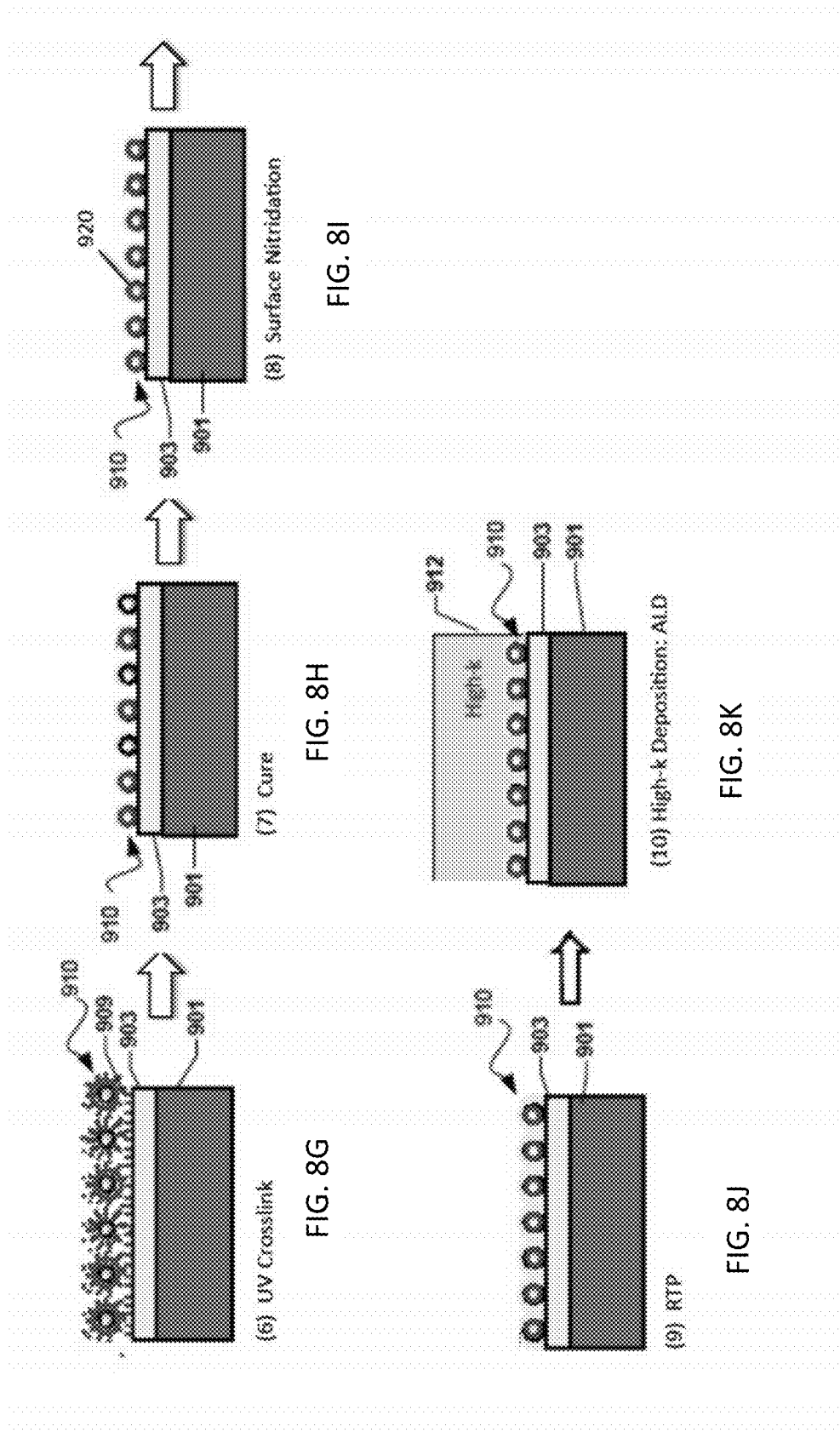

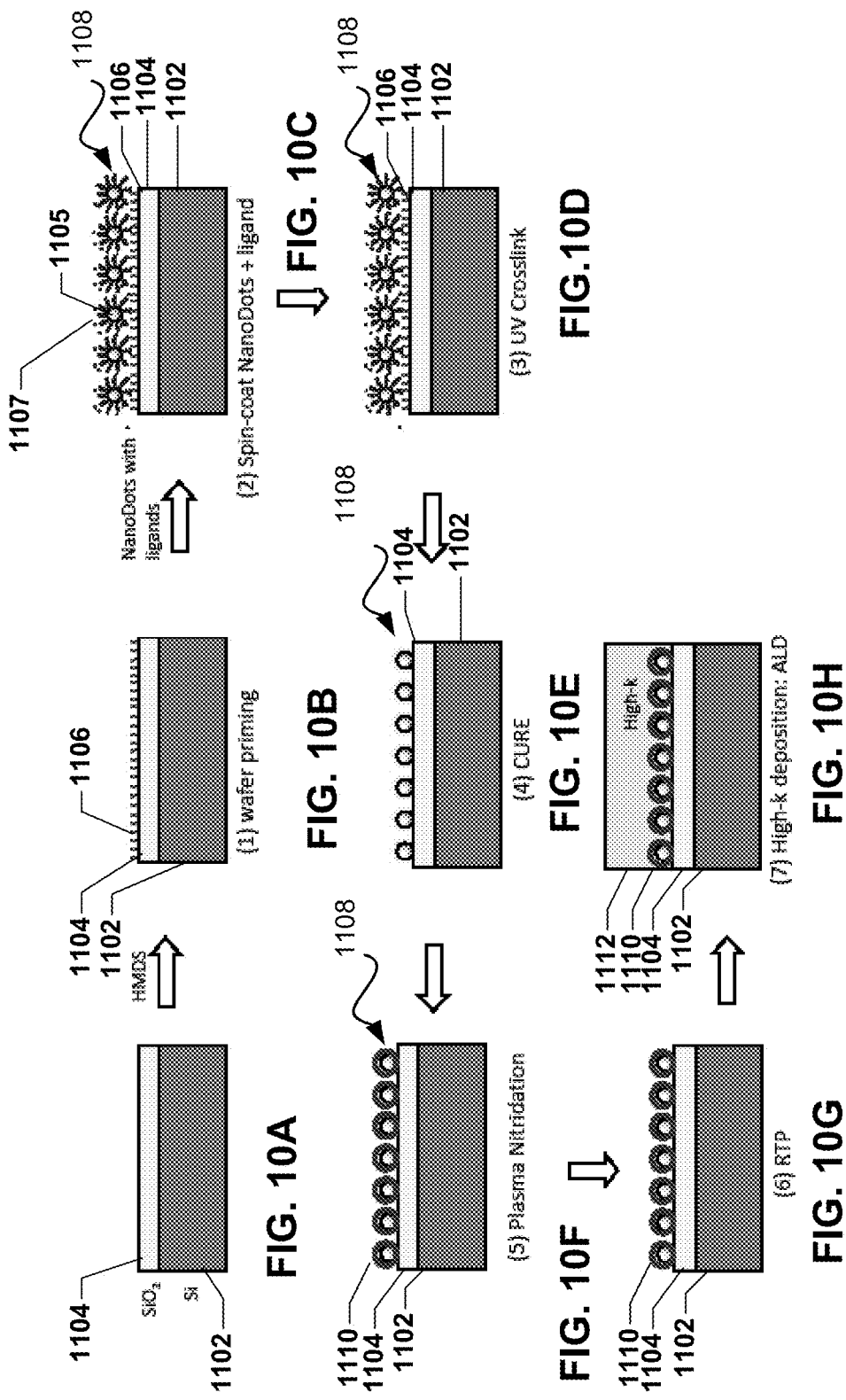

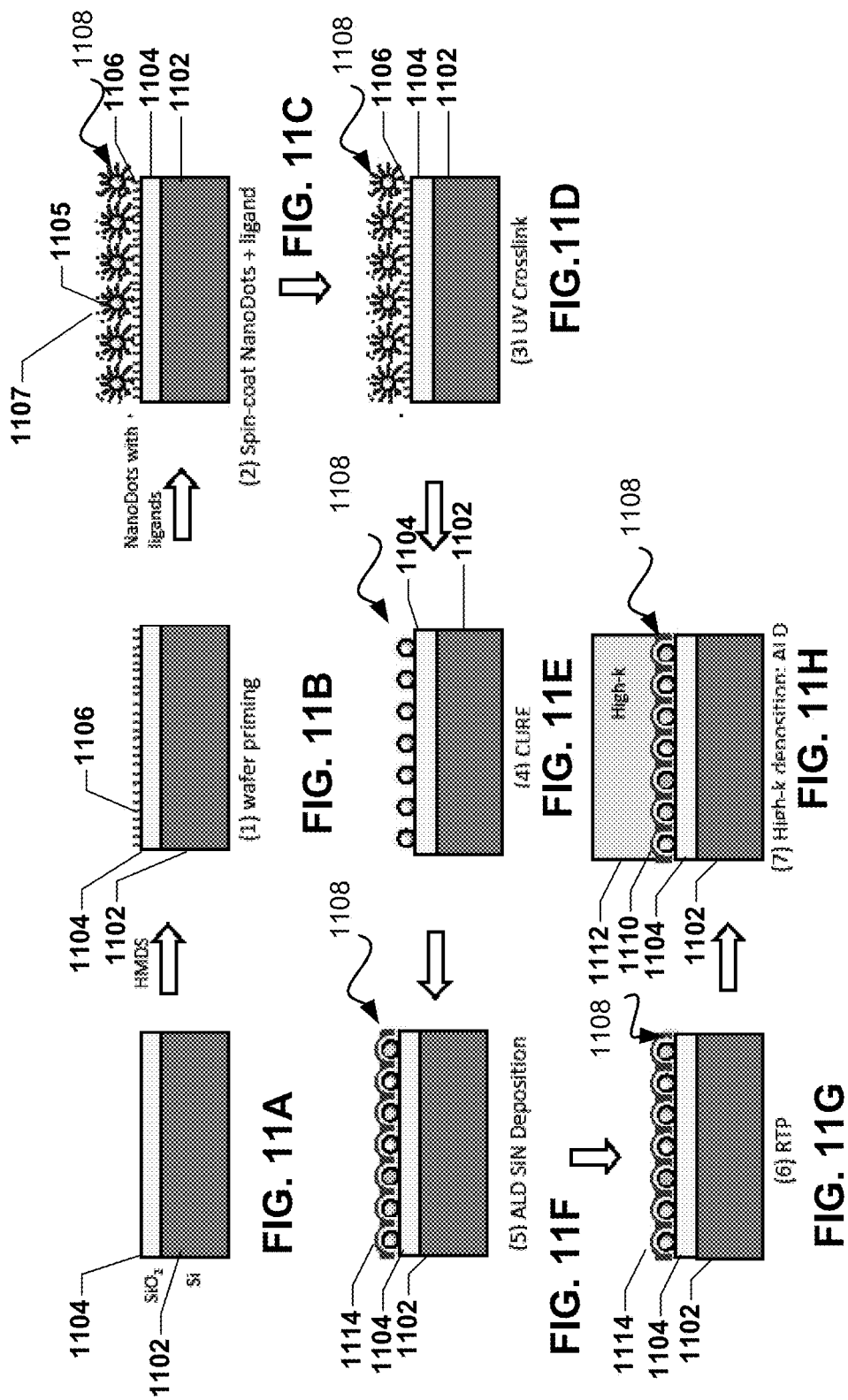

NAND MEMORY DEVICE CONTAINING NANODOTS AND METHOD OF MAKING THEREOF

RELATED APPLICATIONS

This application claims the benefit of priority to U.S. Provisional Application No. 61/667,007, entitled "NAND Memory Device Containing Nanodots," filed on Jul. 2, 2012. This application is related to U.S. application Ser. No. 13/708,677, entitled "Non-Volatile Memory Structure Containing Nanodots and Continuous Metal Charge Traps and Method of Making Thereof," filed on even date herewith. The entire contents of these applications are incorporated by reference herein.

FIELD OF THE INVENTION

The present invention relates to memory having charge-storing nanodots.

BACKGROUND

Semiconductor memory has become increasingly popular for use in various electronic devices. For example, non-volatile semiconductor memory is used in cellular telephones, digital cameras, personal digital assistants, mobile computing devices, non-mobile computing devices and other devices. Electrically Erasable Programmable Read Only Memory (EEPROM) and flash memory are among the most popular non-volatile semiconductor memories. With flash memory, also a type of EEPROM, the contents of the whole memory array, or of a portion of the memory, can be erased in one step, in contrast to the traditional, full-featured EEPROM Both the traditional EEPROM and the flash memory utilize a floating gate that is positioned above and insulated from a channel region in a semiconductor substrate. The floating gate is positioned between the source and drain regions. A control gate is provided over and insulated from the floating gate. The threshold voltage ($V_{TH}$) of the transistor thus formed is controlled by the amount of charge that is retained on the floating gate. That is, the minimum amount of voltage that must be applied to the control gate before the transistor is turned on to permit conduction between its source and drain is controlled by the level of charge on the floating gate.

Some EEPROM and flash memory devices have a floating gate that is used to store two ranges of charges and, therefore, the memory element can be programmed/erased between two states, e.g., an erased state and a programmed state. Such a flash memory device is sometimes referred to as a binary flash memory device because each memory element can store one bit of data.

A multi-state (also called multi-level) flash memory device is implemented by identifying multiple distinct allowed/valid programmed threshold voltage ranges. Each distinct threshold voltage range corresponds to a predetermined value for the set of data bits encoded in the memory device. For example, each memory element can store two bits of data when the element can be placed in one of four discrete charge bands corresponding to four distinct threshold voltage ranges.

Typically, a program voltage $V_{PGM}$ applied to the control gate during a program operation is applied as a series of pulses that increase in magnitude over time. In one possible approach, the magnitude of the pulses is increased with each successive pulse by a predetermined step size, e.g., 0.2-0.4 V. $V_{PGM}$ can be applied to the control gates of flash memory elements. In the periods between the program pulses, verify operations are carried out. That is, the programming level of each element of a group of elements being programmed in parallel is read between successive programming pulses to determine whether it is equal to or greater than a verify level to which the element is being programmed. For arrays of multi-state flash memory elements, a verification step may be performed for each state of an element to determine whether the element has reached its data-associated verify level. For example, a multi-state memory element capable of storing data in four states may need to perform verify operations for three compare points.

Moreover, when programming an EEPROM or flash memory device, such as a NAND flash memory device in a NAND string, typically $V_{PGM}$ is applied to the control gate and the bit line is grounded, causing electrons from the channel of a cell or memory element, e.g., storage element, to be injected into the floating gate. When electrons accumulate in the floating gate, the floating gate becomes negatively charged and the threshold voltage of the memory element is raised so that the memory element is considered to be in a programmed state. More information about such programming can be found in U.S. Pat. No. 6,859,397, titled "Source Side Self Boosting Technique For Non-Volatile Memory," and in U.S. Pat. No. 6,917,542, titled "Detecting Over Programmed Memory," issued Jul. 12, 2005; both of which are incorporated herein by reference in their entirety.

Recent fabrication techniques allow the floating gate of a non-volatile memory to be formed from nanodots, e.g., small charge-storing particles. Such techniques have gained interest as memory device dimensions continue to scale down. However, existing techniques have not been satisfactory in providing nanodots which have a uniform size and alignment, and which can be easily used with existing fabrication techniques.

SUMMARY

Embodiments include methods of fabricating a memory device that include coating a first plurality of nanodots on a tunnel dielectric layer, curing the first plurality of nanodots to attach the nanodots to the tunnel dielectric layer, coating a second plurality of nanodots on the tunnel dielectric layer, curing the second plurality of nanodots to attach the second plurality of nanodots to the tunnel dielectric layer, and depositing a dielectric material over the first plurality of nanodots and the second plurality of nanodots to form a floating gate layer.

Further embodiments include a memory device comprising a semiconductor channel, a tunnel dielectric layer over the semiconductor channel, and a floating gate layer over the tunnel dielectric layer, the floating gate layer comprising a plurality of nanodots within a dielectric material, and the density of the nanodots is greater than $4\times10^{12}$ dots/cm$^2$.

Further embodiments include methods of fabricating a memory device that include coating a plurality of nanodots on a tunnel dielectric layer, forming an oxidation barrier layer over a surface of the nanodots, and depositing a dielectric material over the nanodots to form a floating gate layer.

Further embodiments include a memory device comprising a semiconductor channel, a tunnel dielectric layer over the semiconductor channel, and a floating gate layer over the tunnel dielectric layer, the floating gate layer comprising a plurality of nanodots within a dielectric material, the nanodots having an oxidation barrier layer over a surface of the nanodots.

BRIEF DESCRIPTION OF THE DRAWINGS

The accompanying drawings, which are incorporated herein and constitute part of this specification, illustrate exemplary embodiments of the invention, and together with the general description given above and the detailed description given below, serve to explain the features of the invention.

FIGS. 8A-8K illustrate a process of fabricating a layered semiconductor material in which multiple coatings of a nanodot-containing material are coated onto a substrate to increase the nanodot density of a floating gate layer.

FIGS. 10A-10H illustrate a process of fabricating a layered semiconductor material in which a plurality of nanodots are plasma nitridized to form a SiN barrier layer.

FIGS. 11A-11H illustrate a process of fabricating a layered semiconductor material in which an SiN layer is deposited over a plurality of nanodots form a SiN barrier layer.

DETAILED DESCRIPTION

Figure 1:
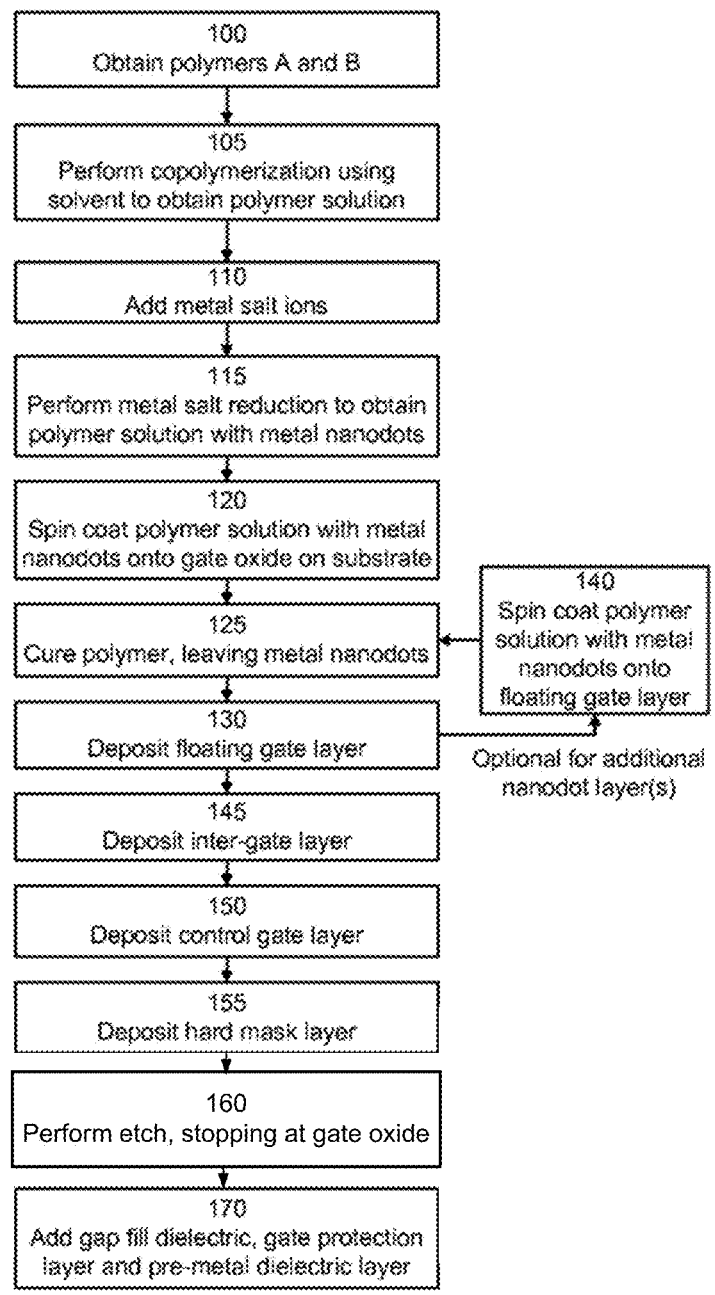
FIG. 1 depicts one embodiment of a process for forming memory having charge-storing nanodots.

The various embodiments will be described in detail with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Nanostructures are small particles that can be formed with charge-storing capabilities. The small size of nanostructures makes them attractive for forming charge storage regions, such as the floating gates for non-volatile memory cells, as device dimensions continue to be scaled-down. In a storage element, nanostructures can be used to store charge (e.g., electrons). The use of nanostructures as charge-storing particles in memory such as non-volatile memory provides many advantages, including allowing reduced programming voltages, resulting in reduced power/current consumption in the memory device, and scaling to ever smaller dimensions in future generation memory devices.

Nanostructures typically have at least one characteristic dimension that is less than about 500 nm along the smallest axis of the structure. Nanostructures may have characteristic dimensions that are less than 500 nm, for example, less than 10 nm, or even less than 1 nm. In some nanostructures, each of its dimensions may be less than 10 nm, or even 1 nm. By way of non-limiting example, nanostructures include nanowires, nanorods, nanotubes, bridge nanostructures, nanotetrapods, tripods, bipods, and roughly or exactly spherical nanostructures which are referred to as nanodots, but may also be referred to as nanoparticles, quantum dots (nanostructure with quantum confinement) or nanocrystals (having a crystalline structure). Nano structures can be, for example, substantially crystalline, substantially mono-crystalline, polycrystalline, amorphous or a combination thereof.

A nanostructure in one example is comprised of substantially spherical nanostructures or nanodots. Nanostructures can include essentially any material. Charge storing nanostructures may include conductors, non-conductors, and semiconductors. By way of non-limiting example, charge storing nanostructures, such as nanodots, may include materials such as silicon nitride (SiN), silicon (Si), Cobalt (Co), gold (Au), iridium (Ir), iron platinum alloys (FePt), nickel (Ni), palladium (Pd), platinum (Pt), ruthenium (Ru), tantalum (Ta), tantalum nitride (TaN), tellurium (Te), tungsten (W), and the like. Electrically conductive nanostructures with high work functions (e.g., 4 eV or higher, such as 4.5-6 eV), such as Ru, Ta or TaN are preferred to adequately trap and store electrons in the nanostructures without leakage across a tunnel dielectric layer in a nonvolatile memory device. An array of nanostructures may be pre-formed or synthesized prior to incorporation into the memory structure. For example, the nanostructures may include a coating having a ligand associated with a surface of the nanostructure, for example, a silsesquioxane ligand. Nanostructures may also be coated with insulating shells such as oxides or nitrides.

Nanostructure coatings may include one or more nanostructure layers. In one embodiment, the nanostructures are free of solvent in their formation, while in others the nanostructures are dispersed in one or more solvents. The nanostructures may form a disordered or ordered array such as an ordered monolayer or multilayer (e.g., spherical, polygonal). A solution of nanostructures can be formed by deposition processes, including spin coating, dip coating, spraying, soaking and other techniques. More information regarding nanostructures and their solutions can be found in U.S. Pat. No. 7,723,186 to Purayath, et al., and U.S. Pat. No. 8,193,055 to Purayath et al., which are both incorporated by reference herein in their entirety.

In one example, polymer micelle technology may be employed to form nanostructures with a high degree of uniformity. Such technology can be used to fabricate self-aligned nanostructures with sizes, e.g., from a few nm to 30 nm (or more). A copolymer solution may be formed, followed by adding salt to provide metal salt ions in a core or micelle, e.g., cavity, of the copolymer, and performing a metal salt reduction to form a metal nanostructure in the core. The polymers may in powdered form, for example, and dissolved in an organic solvent. In other examples, the nanostructures are not dispersed in a solvent.

The copolymer solution with the nanostructures can be deposited onto the substrate. The size and spacing of the nanostructures can be tailored based on the molecular weight of the block copolymer and the amount of the metal salt used.

The amount of charge that may be stored by a nanostructure depends on its size, which is a function of the copolymer ratio that has been used to form the micelle. After being deposited, the solution may be partially or entirely removed from the nanostructures, such as by evaporation.

In one embodiment, a coupling or association agent is used to form the nanostructure coating. A coupling layer may be disposed over a dielectric (e.g., oxide) layer. The coupling layer can include a chemical group that interacts with a nanostructure and/or ligand coating of a nanostructure. The coupling layer may be an amino functional silane group. By way of example, coupling layers include thiol, amine, alcohol, phosphonyl, carboxyl, boronyl, fluorine, phosphinyl, alkyl, aryl, etc.

A nanostructure coating may then be applied over the substrate. The nanostructures may be coated with a ligand to interact with the coupling layer. The nanostructures and/or ligands interact with the coupling layer, forming one or more nanostructure layers over the dielectric (e.g., oxide) layer at the active areas of the substrate. The substrate with the nanostructures can be dried, such as by dry nitrogen blowing with no heat. The coupling layer may be removed after forming the nanostructure coating.

The nanostructure coating may be subjected to ultraviolet (UV) curing over all or a portion of the nanoresist coating. Photoresist or another suitable masking material can be applied over select regions of the coating before applying UV light to the substrate surface. After selectively curing the nanostructure layer, a rinse or wash can be applied to the substrate which will remove the nanostructure layer at locations where it has not been cured. Other techniques can be used to remove the nanostructure layer from select region(s).

Photoactivatable compounds may be incorporated into a nanostructure solution. Where a coupling layer is used, the coupling layer material composition may be photoactivatable, such that the bond between the coupling layer and ligand or nanostructure is formed only upon exposure to light. Numerous photoactivatable compounds as known in the art may be used. By way of example, such compounds may include a phenyl azide group, which when photoactivated can from a covalent bond with, e.g., a silsesquioxane ligand comprising a coating associated with a surface of the nanostructures. Other photoactivatable compounds include an aryl azide group (e.g., a phenyl azide, hydroxphenyl azide, or nitrophenyl group), a psoralen, or a diene.

In a storage element, nanodots can be used to store charge (e.g., electrons). The use of nanodots as charge-storing particles in memory such as non-volatile memory provides many advantages, including allowing reduced programming voltages, resulting in reduced power/current consumption in the memory device, and scaling to ever smaller dimensions in future generation memory devices. Further, nanodots are compatible with conventional fabrication techniques and materials.

During fabrication, a 2D array of nanodots is formed on a substrate with a uniform nanodot size and alignment. Vacuum deposition techniques such as sputtering and evaporation may not be adequate in controlling the alignment of the nanodots and may allow the nanodots to pile up on the edges of steps and/or trenches on the substrate. An improved technique involves the utilization of self-assembling materials which have an ability to generate spatially regular structures. For example, polymer micelle technology may be employed to form metal nanodots with a high degree of uniformity. Such technology can be used to successfully fabricate self-aligned metal or metal alloy nanodots with sizes, e.g., from a few nm to about 30 nm. In one example, the nanodots are metal particles which are generally spherical and have a diameter of about 1 to 30 nm, such as 1-5 nm, for example 1-3 nm. Although, other sizes and shapes can be used as well.

In an example implementation, the polymer micelle technology involves forming a copolymer solution, adding a metal salt to provide metal salt ions in a core or micelle, e.g., cavity, of the copolymer, and performing a metal salt reduction to form a metal nanodot in the core. The copolymer solution with the metal nanodots can be readily deposited onto a substrate by conventional spin-coating or dip-coating techniques, and the remainder of the memory device can subsequently be fabricated. Further, the size and spacing of the metal nanodots can be tailored based on the molecular weight of the block copolymer and the amount of the metal salt used. That is, the two polymers which constitute the copolymer can be selected to achieve a specific nanodot size and spacing. The amount of charge that be stored by a nanodot depends on its size, which is a function of the copolymer ratio that has been used to form the micelle.

Applying Nanodots Using Polymer Solution

FIG. 1 depicts one embodiment of a process for forming memory having charge-storing nanodots. Step 100 includes obtaining first and second polymers referred to as polymers A and B, respectively. Step 105 includes performing copolymerization using a solvent to obtain a polymer solution comprising a copolymer. A copolymer is a product of copolymerization, which refers to the polymerization of two substances (as different monomers, or small molecules) together. Polymerization involves a chemical reaction in which two or more molecules combine to form larger molecules that contain repeating structural units. Step 110 includes adding metal salt ions. Step 115 includes performing a metal salt reduction to obtain a polymer solution with metal nanodots in the cores of the copolymer. Step 120 includes spin coating the polymer solution with the metal nanodots onto a gate oxide on a substrate. Step 125 includes curing the polymer, leaving the metal nanodots on the gate oxide.

Once the nanodots have been deposited on the gate oxide, further fabrication techniques can be employed to complete the memory device. For example, step 130 includes depositing a floating gate layer, step 145 includes depositing an optional inter-gate dielectric material, step 150 includes depositing a control gate layer and step 155 includes depositing a hard mask layer. Optionally, multiple layers of nanodots can be provided as indicated at step 140 by spin coating additional polymer solution to the previously applied floating gate layer/sublayer, and repeating steps 125 and 130. Another option is to deposit an additional oxide layer, in which case the additional polymer solution is applied to the additional oxide layer. This process can be repeated multiple times, if desired, to provide multiple additional layers of nanodots.

Once the hard mask layer has been applied at step 155, the layered material is etched to form memory elements. At step 160, the etch stops at the gate oxide so that a separate stack is formed for each memory element, including a separate floating gate and control gate. Step 170 includes adding a gap fill dielectric such as via a TEOS (tetraethyl orthosilicate) source, a gate protection later such as SiN (silicon nitride) and a pre-metal dielectric layer such as BSPG (borophosphosilicate glass), in one example implementation. Further details of the process of FIG. 1 are discussed next.

Figure 2:
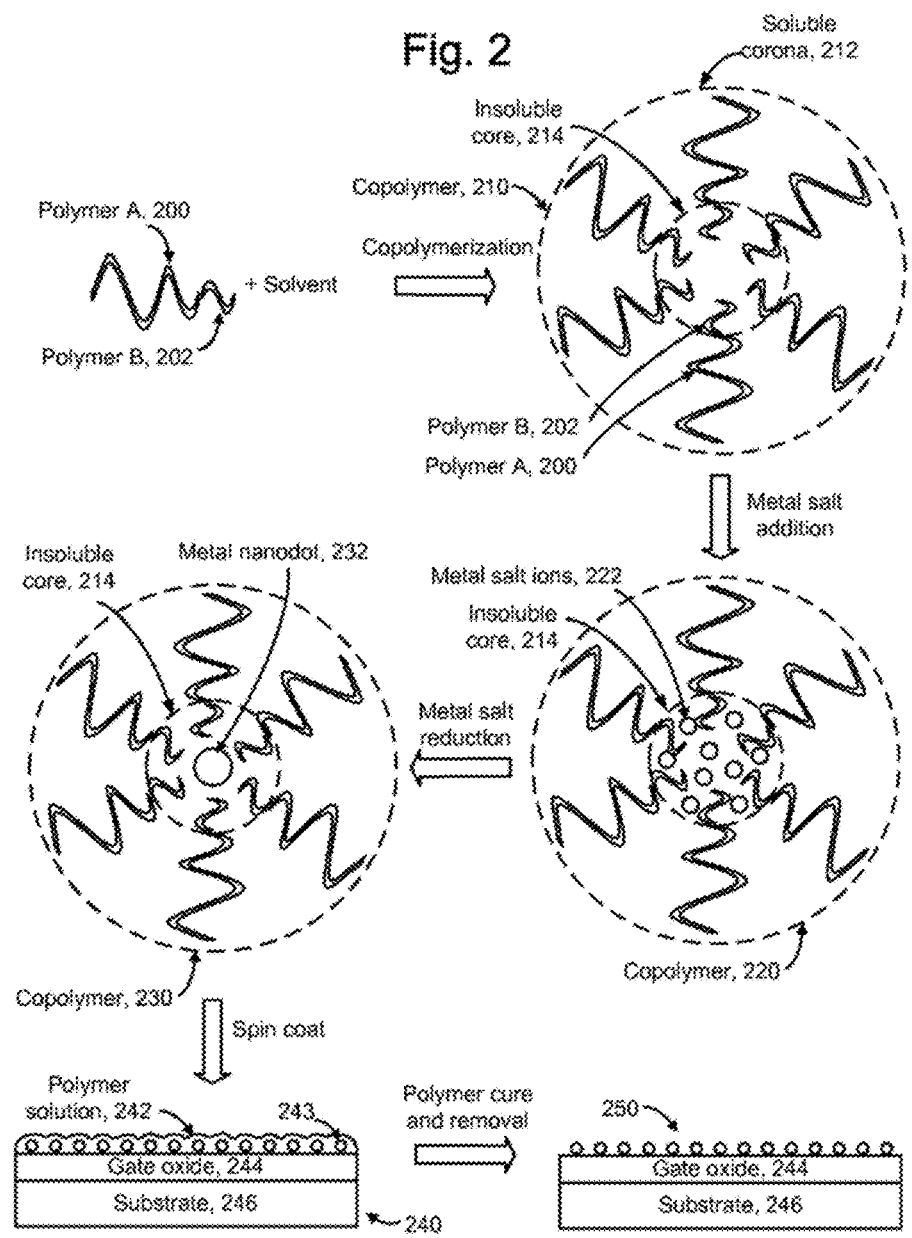
FIG. 2 depicts a process flow for providing metal nanodots in a polymer solution on a substrate.

FIG. 2 depicts a process flow for providing metal nanodots in a polymer solution on a substrate. A substance comprising a first polymer, polymer A 200 and a second polymer, polymer B 202 is depicted as being added to a solvent to perform copolymerization, thereby forming a block copolymer 210 which includes an insoluble core or cavity 214 and a soluble corona 212. Block copolymers are made up of blocks of different polymerized monomers. A diblock copolymer is a block copolymer with two distinct blocks. In this example, the copolymer includes several instances of the polymers A and B joined together end to end. Polymer A attaches to polymer B but not to another polymer A, and polymer B attaches to polymer A but not to another polymer B. In an example implementation, polymer block A is Poly Styrene (PS) and polymer block B is Poly-2Vinylpyridine (P2VP). However, other polymers may be used as well. Polymer A may be hydrophobic while polymer B is hydrophilic. An example solvent is an organic solvent such as Toluene, and an example metal salt is TetraChloroAuric acid (HAuCl4). Other example metal salts include salts of palladium (Pd), iridium (Ir), nickel (Ni), platinum (Pt), gold (Au), ruthenium (Ru), tantalum (Ta), tantalum nitride, cobalt (Co), tungsten (W), tellurium (Te) and iron platinum alloy (FePt). The polymers may be in powdered form, for instance, and dissolved in the organic solvent, with an equal ratio of polymer and solvent, in one approach, stirring. A solvent such as Toluene evaporates out, even at room temperature, due to its low vapor pressure, leaving a polymer solution. Generally, the solvent dissolves the polymers and helps in copolymerization. The copolymerization may take 1-2 days to stabilize at room temperature, in one possible implementation.

The cores 214 may have a diameter of about 1-30 nm, in one possible implementation. The core size can be tailored by choosing the polymer ratio. A broad range of ratios may be used. Polymer B, which is generally the smaller polymer, controls the core size, and thus the nanodot size, and polymer A, which is generally the larger polymer, controls the spacing between cores, and thus the spacing between nanodots. Specifically, the polymer length controls the core size or spacing. The length of polymer B controls the core size, while the spacing between nanodots is set according to the length of polymer A. That is, when the ratio of the length of polymer B to the length of polymer A is relatively small, the spacing between nanodots will be relatively large. And, when the ratio of the length of polymer B to the length of polymer A is relatively large, the spacing between nanodots will be relatively small.

Moreover, the ratio of molecular weights of the polymers controls whether the core is spherical or distorted. Generally, a spherical core is desired as it allows better control of the nanodot size and spacing. A non-spherical nanodot shape such as an egg shape may result in unsymmetrical spacing between nanodots. However, non-spherical nanodots may be used as well since they still have the ability to store a charge. The term "nanodot" or "nano-particle" or the like is meant to include nano sized particles regardless of their shape.

The copolymer 220 is formed after metal salt addition. Here, a number of metal salt ions, including example metal salt ion 222, are added in the core 214. The metal salt can be in powdered or liquid form, and can be obtained from different suppliers. Generally, the core 214 can only take charged ions. There may be one or multiple molecules of the metal salt in a core depending on the size of the metal salt molecules and the size of the core. The copolymer 230 is formed after metal salt reduction, in which the negative charges are removed from the metal salt ions to form neutral metal atoms, and the atoms aggregate to form a metal nanodot 232 in the core 214. The nanodot thus may be a group of metal atoms. The size of the nanodot is a function of the number of atoms which aggregate and this, in turn, is based on the core size, as mentioned, and can be tailored to obtain a desired nanodot size and/or number of metal atoms per nanodot.

A corresponding polymer solution 242 with the nanodots 243 is spin coated onto a gate oxide 244 on a substrate 246 to form a layered semiconductor material 240. A limited amount of the polymer solution 242 may be used to obtain a monolayer of nanodots. Dip coating can also be used but may achieve a less uniform result than spin coating. At this stage, the nanodots are held in position by the polymer. Further, the nanodots are relatively heavy and sink down to rest on the gate oxide. The gate oxide 244 may comprises $SiO_2$ which is thermally grown on a silicon wafer, for instance. After polymer cure and removal, the nanodots remain on the gate oxide 244 to form the layered semiconductor material 250. The nanodots are arranged in a uniform, self-aligned 2D array or matrix on the gate oxide 244. The nanodots may be slightly surface oxidized, which helps them stick to the gate oxide surface. During the polymer cure and removal, the nanodots do not move because each nanodot is being pulled on by polymers on six sides with the same force, assuming a hexagonal configuration of polymers. When a non-spherical shape is used, the nanodots may move during the cure because they are subject to asymmetric forces.

Thus, the concept of polymer micelle formation is employed to form a self-aligned array of nanodots. In one possible implementation, the diblock co-polymer AB in a selective solvent is used to form a micelle having a completely segregated core region consisting only of block A and a shell region consisting of the solvent and the solvent compatible block B. Ionic co-block polymers may be used due to their stability in micelle formation. A wide range of metal salts can be used to introduce the negatively charged metal nanodots into the micelle cores. The metal salt reduction process uses a suitable reducing agent to help reduce the metal ions back to neutral metal dots.

Figure 3:
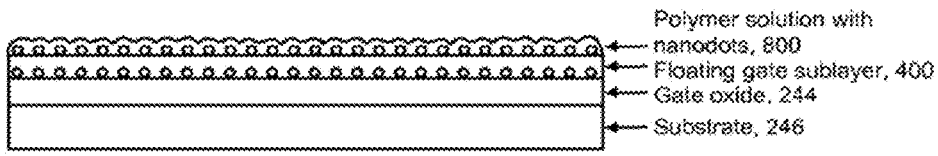
FIG. 3 depicts a layered semiconductor material in which multiple layers of metal nanodots are deposited on a substrate using a polymer solution.

FIG. 3 depicts a layered semiconductor material in which multiple layers of metal nanodots are deposited on a substrate using a polymer solution. In this example, two layers of nanodots are provided on a substrate. Additional layers of nanodots may be desired, e.g., to store a higher level of charge and/or a larger range of different charges, than one level of nanodots provides. Here, the polymer solution with nanodots 800 is applied, e.g., by spin coating, to the floating gate layer or sublayer 400. Polymer cure and removal is performed to leave a second monolayer of nanodots.

Figure 4:
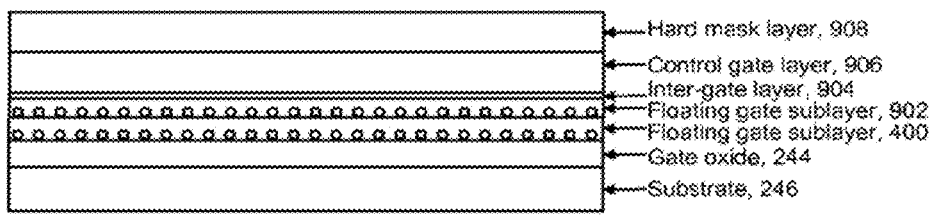
FIG. 4 depicts the layered semiconductor material of FIG. 3 after polymer cure and removal, and after depositing an additional floating gate sublayer, an inter-gate layer, a control gate layer and a hard mask layer.

FIG. 4 depicts the layered semiconductor material of FIG. 3 after polymer cure and removal, and after depositing an additional floating gate sublayer 902, an inter-gate layer 904, a control gate layer 906 and a hard mask layer 908.

Figure 5:
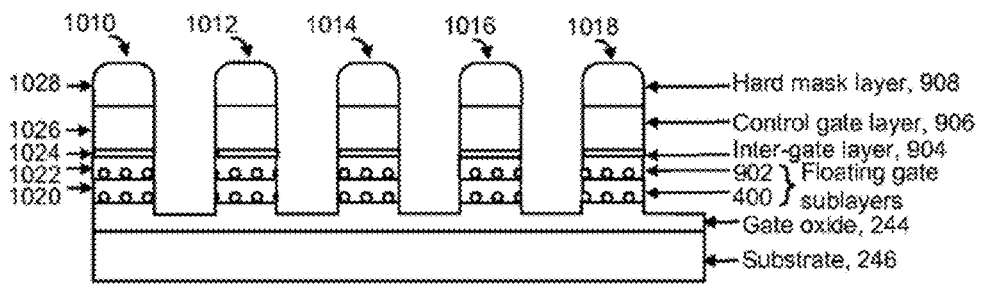
FIG. 5 depicts the layered semiconductor material of FIG. 4 after etching to the gate oxide to form a set of storage elements.

FIG. 5 depicts the layered semiconductor material of FIG. 4 after etching to the gate oxide to form a set of storage elements, including example storage elements 1010, 1012, 1014, 1016 and 1018. Example storage element 1010 includes a first floating gate sublayer portion 1020 and a second floating gate sublayer portion 1022, which collectively form the overall floating gate, an inter-gate layer portion 1024, a control gate 1026 and a hard mask portion 1028.

Figure 6:
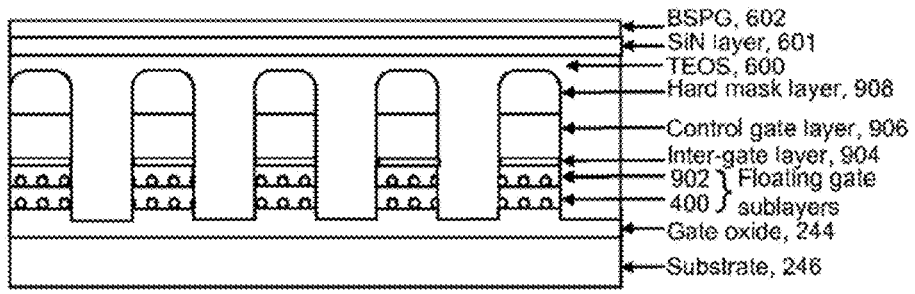
FIG. 6 depicts the layered semiconductor material of FIG. 5 after adding a gap fill dielectric, a gate protection layer and a pre-metal dielectric layer.

FIG. 6 depicts the layered semiconductor material of FIG. 5 after adding a gap fill dielectric such as TEOS 600, a gate protection layer such as silicon nitride (SiN) layer 601 and a pre-metal dielectric layer 602 such as BSPG.

In another approach, nanodots are applied to a substrate using a coupling agent on the substrate. For example, a coupling layer including an amino functional silane group may be provided on a gate oxide on a substrate. The substrate may then be dip coated in a citrate metal aqueous colloidal solution which includes nanodots to form a controlled mono-layer of self aligned metal nanodots on the coupling layer. The coupling layer is then rinsed, leaving the nanodots on the gate oxide.

In an example implementation, the pre-treatment amino functional group is Aminoethylamino Propyl Trimethoxy Silane (APTS), the metal colloidal solution is Aqueous Citrate Gold solution, and removal of the functional group is by dry nitrogen blowing to remove the colloidal solution. Further, examples of nanometer-sized colloidal metal nanoparticles which may be used include palladium (Pd), iridium (Ir), nickel (Ni), platinum (Pt), gold (Au), ruthenium (Ru), tantalum (Ta), tantalum nitride, cobalt (Co), tungsten (W), tellurium (Te) and iron platinum alloy (FePt). Such materials are available from suppliers. In an example configuration, nanodots with a diameter of 2 nm are evenly spaced on a substrate with a density of $1 \times 10^{12}$ nanodots/cm$^2$.

With the concept of functional chemistry to arrange metal nanodots on a pre-treated surface, no polymer material is used, so post curing and cleaning steps are not required. In an example implementation, an amino functional silane is employed as a coupling agent. However, there are wide ranges of functional silanes that can be used for the pre-treatment. The treated surface is oxidized with hydroxyl terminal groups as this plays a major role in helping the functional group silane to adhere to the oxide surface. With this pre-treatment, a variety of aqueous metal colloidal solutions can be used to introduce metal nanodots into active sites in the functional layer. The nanodots react with the functional silane to form a linking layer. The size and type of metal nanodot can be pre-determined by properly choosing the aqueous solution. The nanodots are charge neutral atoms in the colloidal solution, but gain a negative charge after suspension onto the functional group due to reaction with the functional group. This helps to prevent a second layer of nanodots or a distorted arrangement of nanodots.

The functional group can be removed by use of a suitable solvent, which may include a reducing agent which changes the negatively charged nanodot ions into neutral atoms. Optionally, by omitting use of the reducing agent, the negative charge on the nanodots can be maintained while the functional group of the coupling layer is removed. In this case, the negatively charged nanodots are present in the final device and can be removed, e.g., by an erase operation in which a high voltage is applied to the substrate, drawing electrons out of the nanodots in the floating gate.

Amino functional silanes are an example of an association group which acts as a coupling agent for the nanodots. In an example implementation, these amino functional silanes do not have any nano structure or particles within them, but only serve as a coupling agent. Further, in the example implementation, no nano structure solution directly is directly spin coated onto the substrate. Instead, the method may initially start with surface preparation by chemically treating the surface with a coupling agent. Then the prepared substrates may be immersed in a colloidal solution that carries the nano-particles. The presence of the coupling agent activates the attachment of nano-particles present within the colloidal solution on to the activated substrate. Note that the particles are negatively charged and this helps in providing a mono layer since a second layer is repelled. The removal of charge from the nanodots is achieved either during the coupling agent rinse or later on using a common erase operation. This full process approach is different from approaches which use pre-loaded association groups containing nano-particles and spin coating of a nano-particle solution after the association group is formed on a substrate. Separating the depositing of the association group from the depositing of the nanodots allows each process to be optimized and controlled separately.

A further option involves providing one or more layers of nanodots using the polymer approach and one or more layers of nanodots using the coupling agent approach.

As mentioned, the techniques provided herein are applicable to any memory device which uses a charge-storing element, including non-volatile memory such as NAND flash memory.

Process for Achieving Increased Nanodot Density

Various embodiments include a process for achieving increased nanodot density in a nanodot-containing layer of a memory device, such as a floating gate layer or floating gate sub-layer.

In conventional memory devices, the number of nanodots per cell of the memory device substantially decreases as the scale of the device decreases. It is believed that, for example, for a 19×19 nm cell, the highest nanodot density achievable with current fabrication techniques is approximately 15 nanodots/cell. For a 16×15 nm cell, the highest achievable cell density is approximately 11 nanodots/cell, for a 16×13 nm cell, the highest achievable cell density is approximately 9 nanodots/cell, and for a 12×12 nm cell, the highest achievable cell density is approximately 7 nanodots/cell. This causes severe concerns in regard to electron noise and data retention performance.

Figure 7:
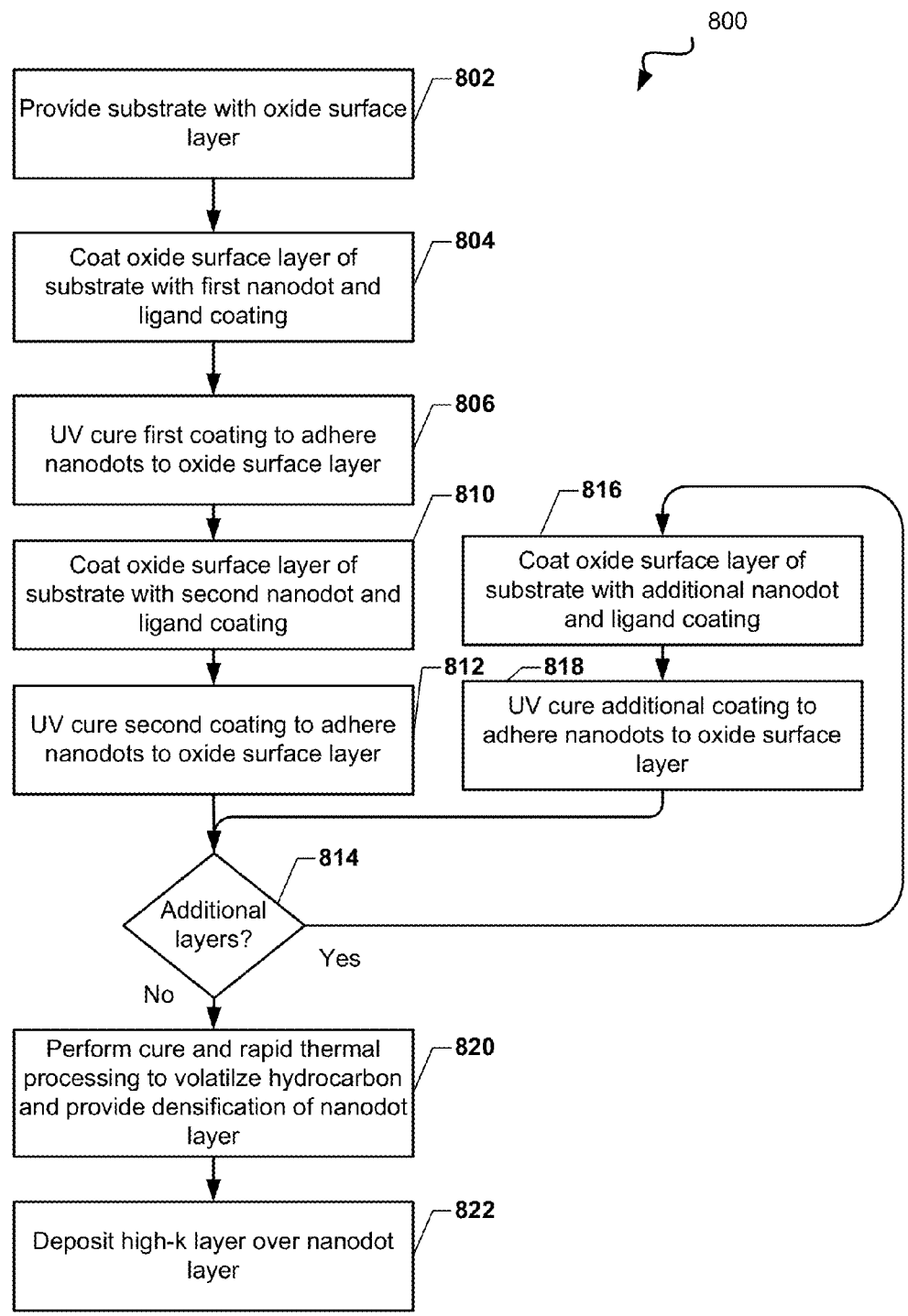
FIG. 7 is a process flow diagram illustrating an embodiment method for forming memory having charge-storing nanodots with increased density.

FIG. 7 depicts a process flow diagram of one embodiment of a process 800 for forming memory having charge-storing nanodots. Step 802 includes providing a substrate with a tunnel dielectric, such as an oxide or nitrided oxide surface layer (e.g., a tunnel oxide layer). An optional coupling agent, such as any suitable organic material which makes the oxide surface hydrophobic (e.g., hexamethyldisilazane (HDMS), etc.) may be provided over the oxide surface layer. Step 804 includes coating the oxide surface layer with nanodots, for example with a first nanodot and ligand coating. Step 804 may include spin coating the nanodots and ligands, which may be in a solution, such as a polymer solution, onto the oxide surface layer (e.g., tunnel oxide). Step 806 includes UV curing the first coating to adhere the nanodots to the oxide surface layer. Optionally, the nanodots may be surface nitrided (such as via plasma nitridation and/or deposition of a SiN barrier layer), as is described below in connection with FIGS. 9A-11H.

In step 810, a second coating of nanodots and ligands is coated on the oxide surface layer. The second coating may increase the density of nanodots in the nanodot layer, filling in gaps left from the first coating of step 804. The second coating may also be provided via spin coating. The second coating is UV cured in step 812 to adhere the additional nanodots to the oxide surface layer.

If a higher nanodot density is desired (block 814=Yes), then one or more additional nanodot and ligand coatings may be provided in step 816 and UV cured in step 818.

Following nanodot deposition (block 814=No), a cure and rapid thermal processing step 820 may be performed to volatize hydrocarbons and provide densification of the nanodot layer. Optionally, the nanodots may be surface nitrided (such as via plasma nitridation and/or deposition of a SiN barrier layer), as is described below in connection with FIGS. 10A-12H. This surface nitridation step may be in addition to or as an alternative to the surface nitridation step described above.

In step 822, a high-k layer, which may be a floating gate layer, is deposited over the nanodots. In various embodiments, a floating gate layer may include a high dielectric constant (high-k) material such as aluminum oxide ($Al_2O_3$), hafnium oxide (HfO$_2$), silicon nitride, zirconium oxide (ZrO$_2$) or combinations of these materials. Other high-k materials may be used as well. High-k materials have a relatively high dielectric constant compared to the dielectric constant of SiO$_2$. However, SiO$_2$ or other oxide for the floating gate layer is also possible.

In some embodiments, the high-k layer may provide a floating gate sublayer, such as floating gate sublayer 400 described and illustrated above in connection with FIGS. 3-6. One or more additional nanodot-containing floating gate sublayers 902 may be deposited over the first nanodot/floating gate sublayer, as described above.

In further embodiments, instead of the additional nanodot-containing floating gate sublayer, a continuous metal layer may be formed over a nanodot-containing floating gate sublayer, as is described below in connection with FIGS. 12 and 13.

Once the nanodots have been deposited on the tunnel oxide, further fabrication techniques can be employed to complete the memory device. For example, steps 145 through step 170 of FIG. 1 may be performed to fabricate the memory device. An inter-gate (e.g., blocking dielectric) layer may be deposited over the floating gate layer, and may include oxide-nitride-oxide (ONO) layers, for instance. The blocking dielectric may comprise an ONO/Al$_2$O$_3$/HfO$_2$ stack in some embodiments. Alternatively, the blocking dielectric may comprise all high-k dielectric material(s), such as Al$_2$O$_3$/HfO$_2$. A control gate layer may be deposited over the inter-gate layer, which may be a conductive layer that includes metal (e.g., tungsten or tungsten nitride) or doped polysilicon, for instance. A barrier metal layer of a suitable material, such as TiSiN or TaN may be formed, such as via atomic layer deposition (ALD) between the surface of the blocking dielectric (e.g., HfO$_2$) and the metal control gate. A hard mask layer may be deposited over the control gate layer and may include any suitable hard mask material. An etch may be performed, stopping at the gate oxide, and a gap dielectric, gate protection layer and pre-metal dielectric layer may be added.

During use of the memory device, the nanodots act as charge-storing elements. For example, in non-volatile memory, a storage element is programmed by applying a voltage to a control gate, as a result of which electrons are drawn into the nanodots in the floating gate from the substrate. The nanodots hold the charge so that a threshold voltage of the storage element is altered based on the amount of charge held. The threshold voltage can be detected during a read operation and translated to a logical data state. During an erase operation, a high voltage is applied to the substrate to draw the electrons back out of the nanodots and into the substrate. Note that it is acceptable for the number of nanodots per floating gate to vary since the same amount of charge can be stored in a different number of nanodots. When there are more nanodots than average in a floating gate, less charge is stored in each nanodot. Similarly, when there are fewer nanodots than average in a floating gate, more charge is stored in each nanodot. The nanodots in the floating gates may store bits which represent two, four, eight or more logical states. Further, in some cases, it may be desired to have multiple levels of nanodots.

FIGS. 8A-8K illustrate a process of fabricating a layered semiconductor material in which multiple coatings of a nanodot-containing material are coated onto a substrate to increase the nanodot density of a floating gate layer. FIG. 8A illustrates a substrate 901, which may be a Si substrate (wafer) having a tunnel oxide layer 903, which may be SiO$_2$ or nitrided silicon dioxide. In FIG. 8B, the substrate 901 is primed by applying an HDMS layer 909 over the gate oxide layer 903. In FIG. 8C, a first coating of nanodots 905 coated with a ligand 907 is deposited on the gate oxide layer 903, such as via spin coating, to form a nanodot layer 910. The first coating of nanodots may be performed to achieve maximum nanodot density (e.g., $3.6 \times 10^{12}$ dots/cm$^2$) in layer 910. Typically, however, there will be gaps 911 in the layer 910 in which there are no nanodots due to coating non-uniformity. In FIG. 8D, the nanodot layer 910 is UV cured to attach the nanodots 905 to the gate oxide layer 903. The UV cure may promote a cross-linking reaction which keeps the nanodots 905 in place during subsequent deposition step(s). In FIG. 8E, an oxidation barrier layer, such as a surface nitride layer 920, such as a SiN barrier shell, is optionally formed over the nanodots to prevent unintentional oxidation of the inner metal (e.g., Ru) nanodot core. In one approach, a plasma nitridation (SPA-nitridation) may be performed to at least partially nitride an outer oxide (e.g., SiO$_2$) shell surrounding each metal nanodot to form a SiN barrier shell having a thickness of <2 nm, e.g., 1-2 nm, on each nanodot. In another approach, a SiN barrier layer may be deposited over the layer of nanodots. In embodiments, the SiN barrier layer may be an ultra-thin (e.g., <2 nm, such as 1-2 nm thick) layer that may be formed by atomic layer deposition (ALD), for example. Methods of surface nitridation of nanodots are described in further detail below in connection with FIGS. 9A-11H.

In FIG. 8F, a second coating of nanodots 913 coated with ligand 907 is applied over layer 910, such as via spin coating. The second coating may fill in all or a portion of the gaps 911 to provide a higher density of nanodots in layer 910. In FIG. 8G, the layer 910 is again UV cured to attach the new nanodots 310 to the gate oxide 903. Further coatings of nanodots coated with ligand may be applied as desired to further fill in any gaps 911 and increase the nanodot density of layer 910. Each successive coating may be UV cured to attach the nanodots to the gate oxide 903. With each successive coating, an oxidation barrier layer, such as a surface nitride layer may optionally be formed over the nanodots.

In FIG. 8H, the nanodot layer 910 is cured to volatilize hydrocarbons. In other words, the organic ligands are volatized and removed from the device by annealing the device at a temperature of 250 C or higher, such as 300-350 C. In FIG. 8I, an oxidation barrier layer, such as a surface nitride layer 920 is optionally formed over the nanodots using the method(s) described above, including the nanodots deposited in the second coating and/or any subsequent coating steps. In FIG. 8J, a rapid thermal processing step (e.g., at 600° C. or higher) is performed to provide densification. In other words, the remaining carbon is driven off from the silicon oxide shell formed on the nanodot by the ligand, and the non-stoichiometric (silicon rich), low density silicon oxide shell is converted to semiconductor device grade stoichiometric, high density silicon dioxide. In embodiments, one or more additional coatings of nanodots can be applied after the rapid thermal processing step to ensure better coverage. In an alternative embodiment, the second nanodot coating 913 may be formed after the RTP step in FIG. 8J. In FIG. 8K, a layer 912 of high-k material is deposited over the nanodots 910. The nanodots 910 may be covered by the high-k layer 912 to form a floating gate layer for a memory device. Thus, in this embodiment, plural nanodot coating steps are performed prior to forming the high-k floating gate material over the nanodots (i.e., coating the second plurality of nanodots on the tunnel dielectric layer occurs prior to deposition of any permanent dielectric layer over the first plurality of nanodots). In various embodiments, the density of the nanodot layer 910 in the finished floating gate may be greater than $2 \times 10^{12}$ dots/cm$^2$ (e.g., ≥4×10$^{12}$ dots/cm$^2$), such as 2×10$^{12}$-2×10$^{13}$ dots/cm$^2$ (e.g., 2×10$^{12}$-5×10$^{12}$ dots/cm$^2$).

Oxidation Prevention with SiN Barrier Layer

Various embodiments include a process for preventing or reducing oxidation of nanodots in a nanodot-containing layer of a memory device, such as a floating gate layer or floating gate sub-layer, by forming a nitride barrier shell and/or layer on the nanodots.

Figure 9A:
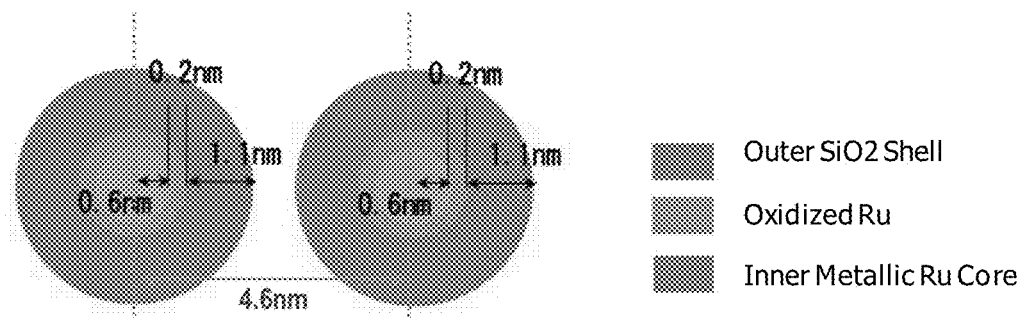
FIG. 9A schematically illustrates the structure of two ruthenium nanodots.

As shown in FIG. 9A, the nanodots may be made of a high work function metal or metal alloy material, such as ruthenium (Ru). Metal nanodots may have an outer metal oxide layer (e.g., RuO$_{2\pm x}$ where 0≤x≤0.5), and may further be encapsulated in a silicon oxide shell (e.g., a silicon rich silicon oxide shell) formed by a ligand coating. However, the outer silicon oxide may not be homogeneous, and there may be places without silicon oxide coverage. Some device fabrication process steps, such as atomic layer deposition (ALD) of a high-k (e.g., HfO$_2$) floating gate layer or other active area and control gate post etch cleaning processes pose concerns with respect to oxidation when the metal (e.g., Ru) nanodot is exposed.

ALD formation of HfO$_2$ is of particular concern due to the O$_3$ purge cycle from the HfO$_2$ deposition step that may cause oxidation of Ru nanodots. Alternative approaches, such as using an H$_2$O-based HfO$_2$ process may not be satisfactory, since they are self-limited by leakage currents due to film quality degradation. In addition, post etch cleaning processes still pose concern of Ru oxidation during ashing steps or gap-fill dielectric formation. Each of these steps may contribute to unwanted oxidation, and more than 50% of Ru nanodots may be oxidized or ashed away.

In various embodiments, a barrier layer, such as a silicon nitride ("SiN") barrier layer, may be provided over the nanodots to prevent unintentional oxidation of the inner metal (e.g., Ru) nanodot core. As used herein "SiN" includes non-stoichiometric silicon nitride (e.g., Si$_3$N$_{4\pm x}$, wherein X≤0.5), oxygen containing silicon nitride (e.g., silicon oxynitride) and stoichiometric silicon nitride. The barrier layer may have a thickness that is less than 3 nm (e.g., 1-2 nm), which may be sufficient to prevent oxidation but not sufficient to trap charge. In various embodiments, a plasma nitridation step may be performed to at least partially nitridize (i.e., nitride) the silicon oxide shell surrounding the metal nanodot to form a SiN barrier shell. Alternatively or in addition, a thin SiN (e.g., <3 nm, e.g., 2 nm) barrier layer may be deposited on the nanodots, such as via atomic layer deposition (ALD).

Figure 9B:
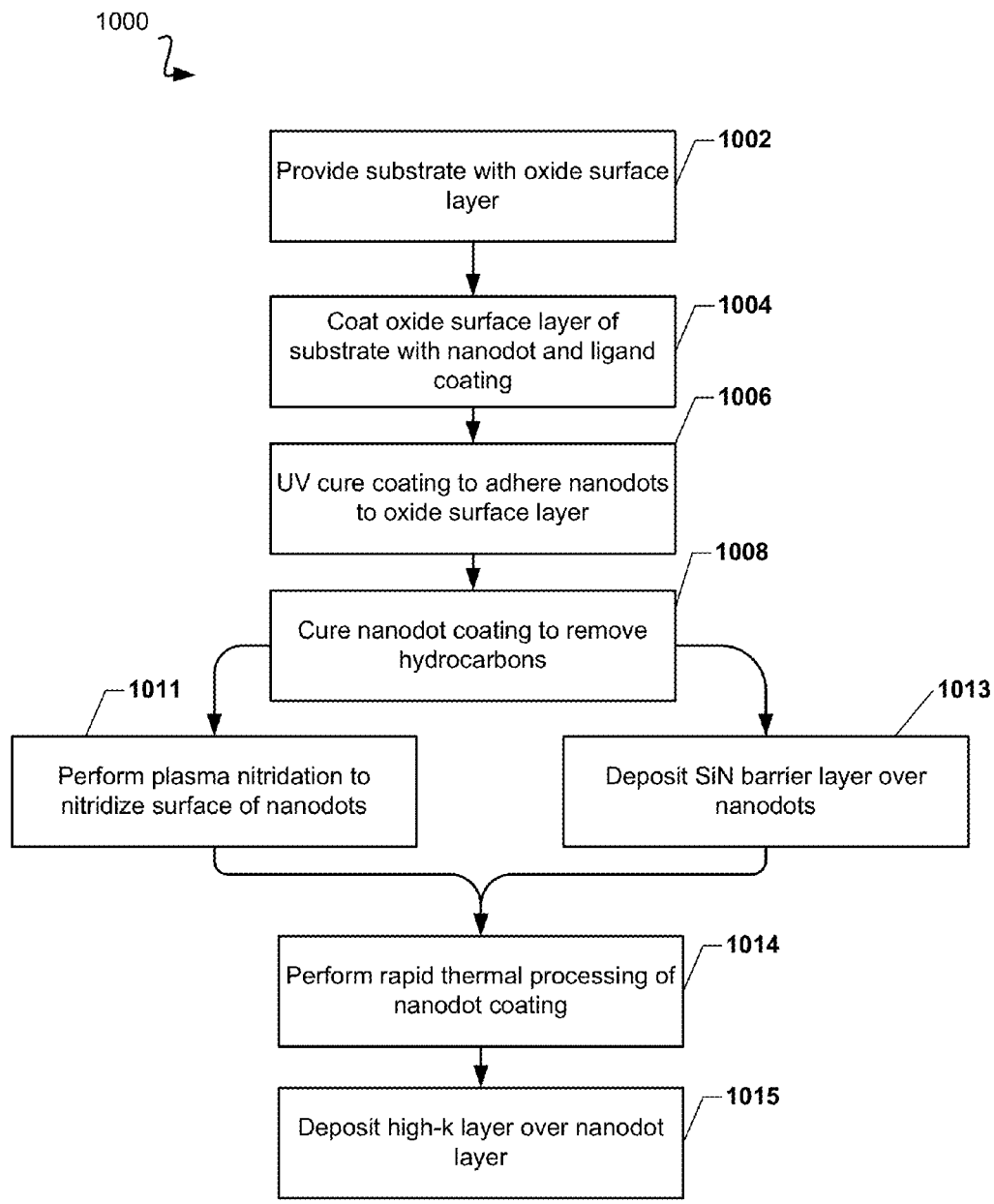
FIG. 9B is a process flow diagram illustrating an embodiment method for forming memory having charge-storing nanodots with a SiN barrier layer.

FIG. 9B depicts a process flow diagram of one embodiment of a process 1000 for forming memory having charge-storing nanodots. Step 1002 includes providing a substrate with a tunnel dielectric (e.g., silicon oxide). An optional coupling agent, such as hexamethyldisilazane (HDMS), may be provided over the oxide surface layer. Step 1004 includes coating the oxide surface layer with nanodot coating, such as a nanodot and ligand coating. Step 1004 may include spin coating the nanodots and ligands, which may be in a solution, such as a polymer solution, onto the oxide surface layer (e.g., gate oxide). The nanodots may comprise metal nanodots, such as Ru nanodots, coated with a ligand. Step 1006 includes UV curing the coating to adhere the nanodots to the oxide surface layer. Additional nanodot coating and UV curing steps may be performed as desired to increase the density of the nanodot layer, as described above in connection with FIGS. 7-8K.

In step 1008, the nanodot layer may be cured to remove hydrocarbons (e.g., ligands). After curing, a protective barrier shell, such as a SiN barrier shell, may be provided over the nanodots to prevent unintentional oxidation of the inner metal (e.g., Ru) nanodot core. In one approach, at step 1011, a plasma nitridation (SPA-nitridation) may be performed to at least partially nitridize an outer oxide (e.g., SiO$_2$) shell surrounding the metal nanodot to form a SiN barrier layer. Nitridizing the SiO$_2$ shell to SiN may provide an effective barrier to O$_2$ at temperatures <700° C. Further, the additional anneal step may help remove any remaining hydrocarbons. The presence of trace carbon in the nanodots may require the plasma nitridation to be performed at a temperature in a range between room temperature (e.g., 20° C.) and about 500° C. to avoid unwanted carbon poisoning.

In another approach, at step 1013 a SiN barrier layer may be deposited over the layer of nanodots. In embodiments, the SiN barrier layer may be an ultra-thin (e.g., <3 nm, such as 1-2 nm) layer that may be formed by atomic layer deposition (ALD), for example.

In step 1014, rapid thermal processing (RTP) may be performed on the nanodot layer to densify the shell. In embodiments, the SiN barrier layer may be formed following the RTP step. After RTP, in step 1015 a high-k layer, which may be a floating gate layer, is deposited over the nanodots with SiN barrier layers. Thus, the nanodots are located on the tunnel dielectric and the floating gate layer is formed over and around the nanodots. In various embodiments, a floating gate layer may include a high dielectric constant (high-k) material such as aluminum oxide (Al$_2$O$_3$), SiN, hafnium oxide (HfO$_2$), zirconium oxide (ZrO$_2$) or combinations of these materials. Other high-k materials may be used as well. High-k materials have a relatively high dielectric constant compared to the dielectric constant of SiO$_2$. However, SiO$_2$ or other oxide for the floating gate layer is also possible.

In some embodiments, the high-k layer may provide a floating gate sublayer, such as floating gate sublayer 400 described and illustrated above in connection with FIGS. 3-6. One or more additional nanodot-containing floating gate sub-layers 902 may be deposited over the first nanodot/floating gate sublayer, as described above.

In further embodiments, instead of the additional nanodot-containing floating gate sublayer, a continuous metal layer may be formed over a nanodot-containing floating gate sub-layer, as is described below in connection with FIGS. 12 and 13.

Once the nanodots have been deposited on the gate oxide, further fabrication techniques can be employed to complete the memory device. For example, steps 145 through step 170 of FIG. 1 may be performed to fabricate the memory device. An inter-gate (e.g., blocking dielectric) layer may be deposited over the floating gate layer, and may include oxide-nitride-oxide (ONO) layers, for instance. The blocking dielectric may comprise an ONO/Al$_2$O$_3$/HfO$_2$ stack in some embodiments. Alternatively, the blocking dielectric may comprise all high-k dielectric material(s), such as Al$_2$O$_3$/HfO$_2$. A control gate layer may be deposited over the inter-gate layer, which may be a conductive layer that includes metal (e.g., tungsten or tungsten nitride) or doped polysilicon, for instance. A barrier metal layer of a suitable material, such as TiSiN or TaN may be formed, such as via atomic layer deposition (ALD) between the surface of the blocking dielectric (e.g., HfO$_2$) and the metal control gate. A hard mask layer may be deposited over the control gate layer and may include any suitable hard mask material. An etch may be performed, stopping at either the gate oxide or the floating gate layer, and a gap dielectric, gate protection layer and pre-metal dielectric layer may be added.

FIGS. 10A-10H illustrate a process of fabricating a layered semiconductor material in which metal nanodots are nitridized by plasma nitridation to form a SiN barrier shell against oxidation of the metal nanodot core. FIG. 10A illustrates a substrate 1102, which may be a Si substrate (wafer) having a tunnel oxide layer 1104, which may be $SiO_2$. In FIG. 10B, the substrate 1101 is primed by applying an HDMS layer 1106 over the gate oxide layer 1104. In FIG. 10C, a layer 1108 of nanodots 1105 coated with a ligand 1107 is deposited on the gate oxide layer 1104, such as via spin coating. In FIG. 10D, the nanodot layer 1108 is UV cured to attach the nanodots 1105 to the gate oxide layer 1104. The UV cure may promote a cross-linking reaction which keeps the nanodots 1105 in place during subsequent processing steps. Additional coatings of nanodots 1105 coated with ligand 1107 may optionally be applied and UV cured to fill in gaps and provide a higher nanodot density, as described above in connection with FIGS. 7-8K. In FIG. 10E, the nanodot layer 1108 is cured to volatilize hydrocarbons. In FIG. 10F, a plasma nitration (SPA-nitridation) is performed to at least partially nitridize an outer oxide (e.g., $SiO_2$) shell surrounding the metal nanodot to form a SiN barrier shell 1110. In FIG. 10G, a rapid thermal processing step is performed. In FIG. 10H, a layer 1112 of high-k material is deposited over the layer 1108 of nanodots 1105 having a SiN barrier shell 1110. The nanodot layer 1108 may be embedded within the high-k layer 1112 to form a floating gate layer for a memory device.

FIGS. 11A-11H illustrate a process of fabricating a layered semiconductor material in which a SiN barrier layer is deposited over a metal nanodot layer to reduce or prevent oxidation of the metal nanodot cores. FIGS. 11A-11E are identical to FIGS. 10A-10E, described above. In FIG. 11F, a thin (e.g., <2 nm) SiN barrier layer 1114 is deposited over the nanodot layer 1108. The barrier layer 1114 may be deposited by ALD, for example. In FIG. 11G, a rapid thermal processing step is performed. In FIG. 11H, a layer 1112 of high-k material is deposited over the layer 1108 of nanodots 1105 having a SiN barrier layer 1114. The nanodot layer 1108, barrier layer 114 and the high-k layer 1112 form a floating gate for a memory device.

Floating Gate Having Nanodot Layer and Continuous Metal Layer

Various embodiments include a memory device having a floating gate (i.e., charge trap) comprising at least one nanodot layer and at least one continuous metal layer. The nanodot layer and the continuous metal layer may be separated by a thin (e.g., 1-4 nm) dielectric separation layer.

As discussed above, the number of nanodots per cell of a memory device substantially decreases as the scale of the device decreases. This causes concerns regarding electron noise and data retention performance.

Various embodiments include memory devices (e.g., memory cells) having at least two different charge trap layers. A first charge trap layer may comprise metal (e.g., Ru, Ta, TaN, etc.) nanodots, and may be formed using any of the methods as described above. A second charge trap layer may be a continuous metal sheet. The continuous metal sheet may be made from the same material (e.g., Ru, Ta, TaN, etc.) as the nanodot material or from another material with a similar work function (e.g., which differs by 0.3 eV or less). In embodiments, the first charge trap layer comprising nanodots may be a "bottom" layer (i.e., adjacent to the tunnel dielectric), and the second charge trap layer comprising a continuous metal sheet may be a "top" layer (e.g., adjacent to the blocking dielectric). The two layers of charge trap material may be separated by an ultra-thin (e.g., 1-4 nm) separation layer that may be formed of a suitable dielectric material (e.g., SiN described above, $HfO_2$, and/or $Al_2O_3$). The dielectric separation layer may be formed by ALD, for example. The thickness of the continuous metal sheet may be 2-5 nm, for example.

By using this cell design, advantages of a conventional nanodot flat cell may be utilized with no compromise (e.g., data retention, endurance and wider program—erase window (i.e., threshold voltage range)). In addition, if there are any missing nanodots in the nanodot layer, the continuous metal layer will help to maintain the threshold voltage, $V_t$ of the cell.

Figure 12:
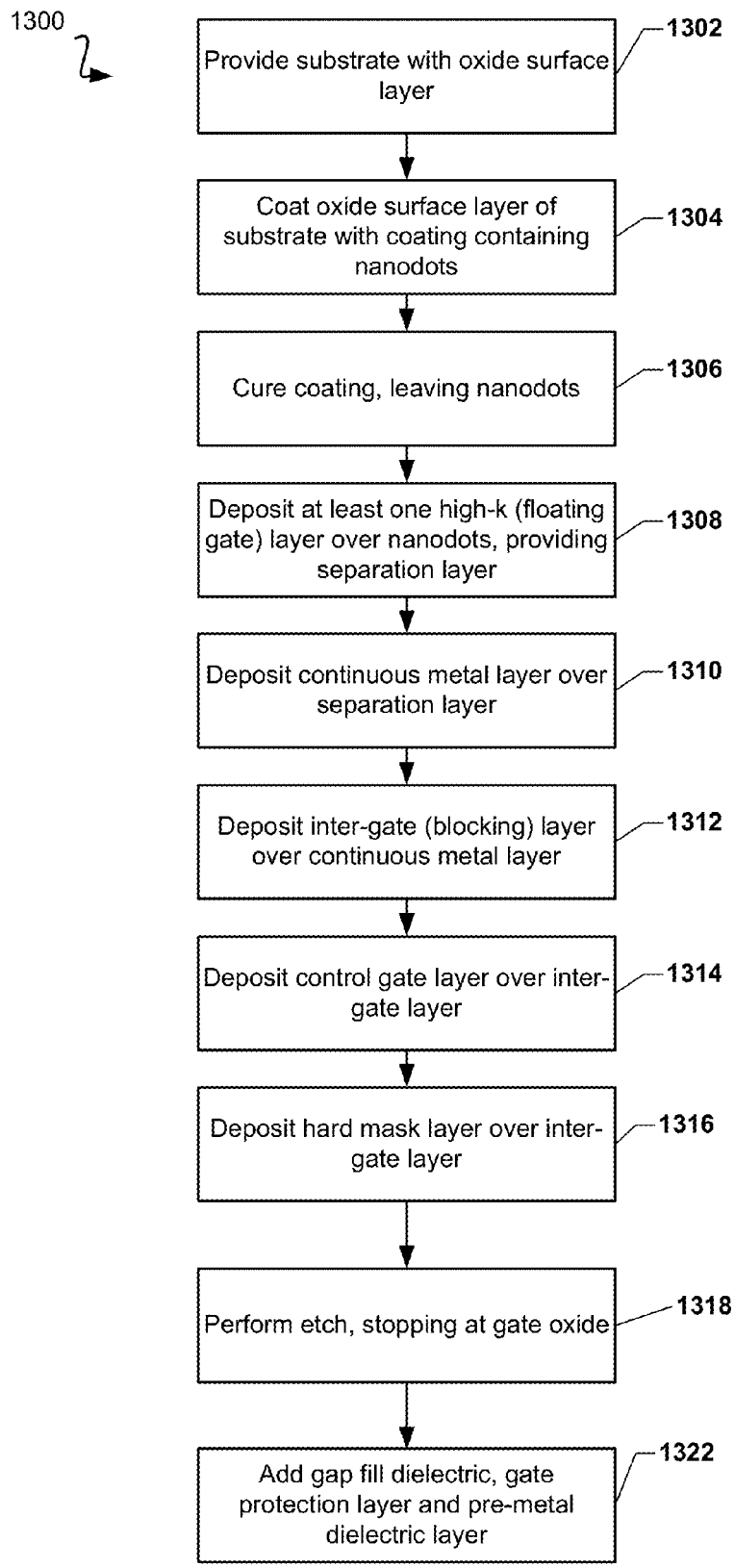
FIG. 12 is a process flow diagram illustrating an embodiment method for forming memory having charge-storing nanodots with a continuous metal charge trap layer.

FIG. 12 depicts one embodiment of a process 1300 for forming memory having a charge trap (floating gate) comprising at least one nanodot layer and at least one continuous metal layer. Step 1302 includes providing a substrate with a tunnel dielectric layer (e.g., a tunnel oxide layer). An optional coupling agent, such as hexamethyldisilazane (HDMS), may be provided over the oxide surface layer. Step 1304 includes coating the oxide surface layer with a nanodot layer. The nanodots may be formed by any suitable method. For example, the nanodots may be in a solution, such as a polymer solution, that is spin coated onto the tunnel dielectric. The nanodots may comprise metal nanodots, such as Ru nanodots, coated with a ligand. Step 1306 includes curing the nanodot coating, removing any hydrocarbons and leaving the nanodots attached to oxide surface layer. The curing step may include UV curing the coating to adhere the nanodots to the oxide surface layer. Additional nanodot coating and UV curing steps may be performed as desired to increase the density of the nanodot layer, as described above in connection with FIGS. 7-8K.

Following curing, a protective barrier layer, such as a SiN barrier layer may optionally be provided over the nanodots to prevent unintentional oxidation of the inner metal (e.g., Ru) nanodot core. Various approaches for providing a barrier layer are described above in connection with FIGS. 9A-11H.

In step 1308 a high-k layer is deposited over the nanodots to provide a separation layer. The high-k layer may cover the nanodots within a high-k material and may further provide a thin (e.g., 1-4 nm) separation layer over the nanodots.

In some embodiments, the high-k layer may provide a floating gate sublayer, such as floating gate sublayer 400 described and illustrated above in connection with FIGS. 3-6. One or more additional nanodot-containing floating gate sublayers 902 may be deposited over the first nanodot/floating gate sublayer, as described above.

In step 1310, a continuous metal layer is deposited over the separation layer. The continuous metal layer may be of same material as the nanodots. The continuous metal layer may be deposited by ALD, for example, and may have a thickness of 2-5 nm.

In step 1312, an inter-gate (e.g., blocking dielectric) layer may be deposited over the continuous metal layer, and may include oxide-nitride-oxide (ONO) layers, for instance. In step 1314, a control gate layer may be deposited over the inter-gate layer, which may be a conductive layer that includes metal (e.g., tungsten or tungsten nitride) or doped polysilicon, for instance. In step 1316, a hard mask layer may be deposited over the control gate layer and may include any suitable hard mask material. In step 1318, an etch may be performed, stopping at the gate oxide (i.e., tunnel dielectric) layer. In step 1322, a gap dielectric, gate protection layer and pre-metal dielectric layer may be added.

Figure 13:
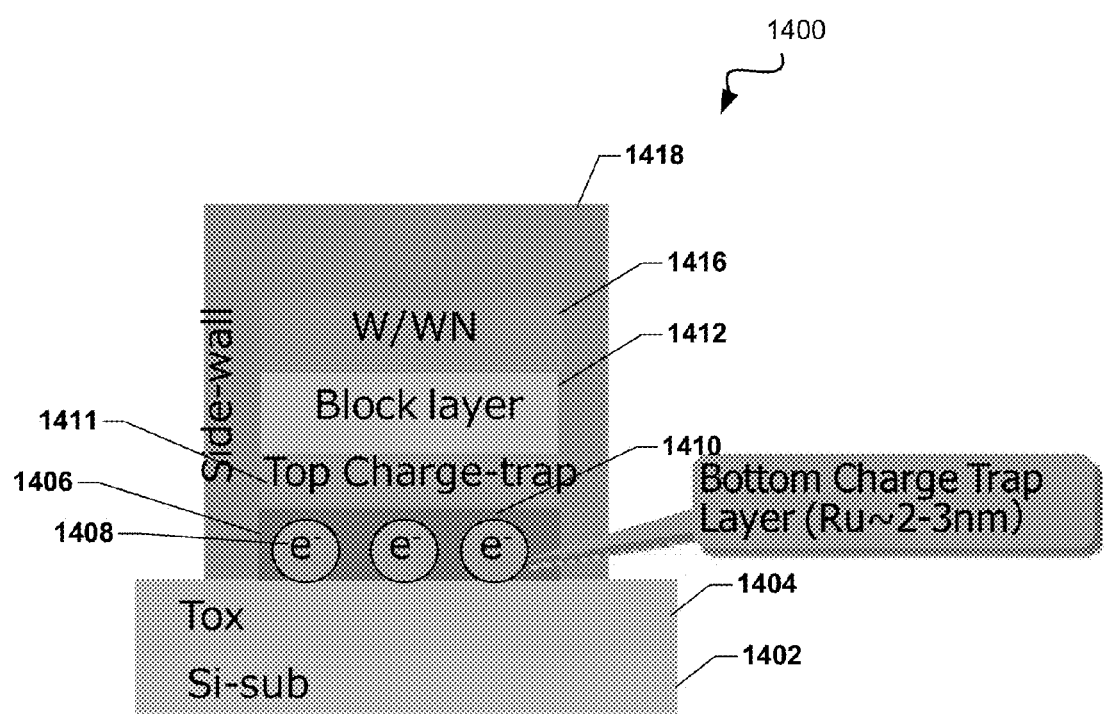
FIG. 13 is a schematic cross section of a cell of a memory device having a nanodot charge trap and a continuous metal floating gate.

FIG. 13 is a schematic cross-sectional illustration of a cell 1400 of a memory device having a nanodot charge trap and a continuous metal charge trap. The cell 1400 includes a semiconductor (e.g., silicon) substrate 1402 and a tunneling oxide (e.g., $SiO_2$) layer 1404 over the substrate. A first charge trap comprises a plurality of nanodots 1408 embedded in an optional SiN barrier shell 1406. The nanodots 1408 may be 1-30 nm in diameter (e.g., 2-3 nm diameter), and may be formed of a metal material, such as Ru, Ta, TaN, Au, Pd, Ir, Ni, Pt, Co, W, Te, FePt, etc.

Above the nanodots 1408 is a separation layer 1410, which is preferably formed of a high-k dielectric material which may be the same or different than the dielectric material 1406 in which the nanodots 1408 are embedded. Above the separation layer is a second charge trap 1411, which is a continuous metal layer. The metal layer may be formed from a metal material which may be the same or different than the nanodot 1408 material. The first and second charge trap layers may provide a floating gate of the memory cell 1400.

Above the second charge trap 1411 is a blocking dielectric layer 1412 (intergate dielectric layer), which may be an ONO material ($SiO_2/Si_3N_4/SiO_2$) and/or a combination of high-k dielectrics ($Al_2O_3/HfO_2$). Above the blocking dielectric layer 1412 is a control gate 1416, which may be a metal (e.g., W or WN) or polysilicon material. A barrier metal (e.g., TiSiN or TaN) may be provided between the blocking dielectric layer 1412 and the control gate 1416, as described above. A dielectric material 1418 may be provided over the top and sidewall surfaces of the gate stack of the cell 1400.

Figure 14:
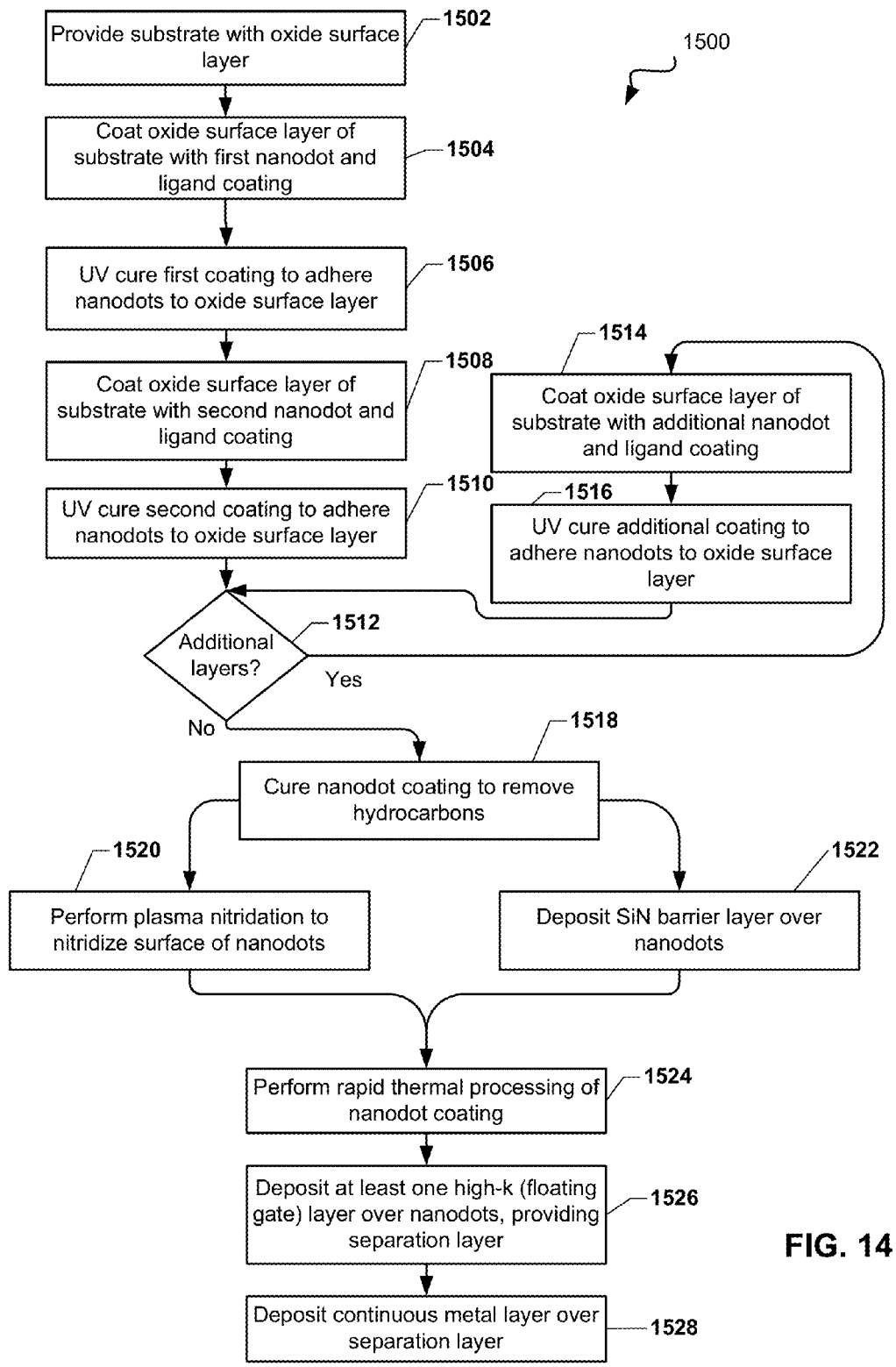
FIG. 14 is a process flow diagram illustrating an embodiment method for forming memory according to plural embodiments described above.

FIG. 14 depicts a combined process flow diagram of all three embodiments described above with respect to FIGS. 7, 9B and 12 for forming a memory having charge-storing nanodots. Step 1502 includes providing a substrate with a tunnel dielectric, such as an oxide or nitrided oxide surface layer (e.g., a tunnel oxide layer). An optional coupling agent, such as any suitable organic material which makes the oxide surface hydrophobic (e.g., hexamethyldisilazane (HDMS), etc.) may be provided over the oxide surface layer. Step 1504 includes coating the oxide surface layer with nanodots, for example with a first nanodot and ligand coating. Step 1504 may include spin coating the nanodots and ligands, which may be in a solution, such as a polymer solution, onto the oxide surface layer (e.g., tunnel oxide). Step 1506 includes UV curing the first coating to adhere the nanodots to the oxide surface layer. An oxide barrier layer, such as a surface nitride layer may optionally be formed over the first nanodot coating, such as by plasma nitridation or deposition (e.g., by ALD) of a SiN barrier layer.

In step 1510, a second coating of nanodots and ligands is coated on the oxide surface layer. The second coating may increase the density of nanodots in the nanodot layer, filling in gaps left from the first coating of step 1504. The second coating may also be provided via spin coating. The second coating is UV cured in step 1512 to adhere the additional nanodots to the oxide surface layer.

If a higher nanodot density is desired (block 1514=Yes), then one or more additional nanodot and ligand coatings may be provided in step 1516 and UV cured in step 1518. Following any of the second and/or additional coatings, a surface nitride layer may optionally be formed over the nanodots.

Following nanodot deposition (block 1514=No), in step 1518, the nanodot layer may be cured to remove hydrocarbons (e.g., ligands). After curing, a protective barrier shell, such as a SiN barrier shell, may be provided over the nanodots to prevent unintentional oxidation of the inner metal (e.g., Ru) nanodot core. In one approach, at step 1520, a plasma nitridation (SPA-nitridation) may be performed to at least partially nitridize an outer oxide (e.g., $SiO_2$) shell surrounding the metal nanodot to form a SiN barrier layer. Nitridizing the $SiO_2$ shell to SiN may provide an effective barrier to $O_2$ at temperatures <700° C. Further, the additional anneal step may help remove any remaining hydrocarbons.

In another approach, at step 1522, a SiN barrier layer may be deposited over the layer of nanodots. In embodiments, the SiN barrier layer may be an ultra-thin (e.g., <3 nm, such as 1-2 nm) layer that may be formed by atomic layer deposition (ALD), for example.

In step 1524, rapid thermal processing (RTP) may be performed on the nanodot layer to densify the shell. In embodiments, the SiN barrier layer may be formed following the RTP step.

In step 1526 a high-k layer is deposited over the nanodots to provide a separation layer. The high-k layer may cover the nanodots within a high-k material and may further provide a thin (e.g., 1-4 nm) separation layer over the nanodots.

In some embodiments, the high-k layer may provide a floating gate sublayer, such as floating gate sublayer 400 described and illustrated above in connection with FIGS. 3-6. One or more additional nanodot-containing floating gate sublayers 902 may be deposited over the first nanodot/floating gate sublayer, as described above.

In step 1528, a continuous metal layer is deposited over the separation layer. The continuous metal layer may be of same material as the nanodots. The continuous metal layer may be deposited by ALD, for example, and may have a thickness of 2-5 nm.

After depositing the continuous metal layer, the process steps described above with regard to FIG. 12 may be performed. For example, an inter-gate (e.g., blocking dielectric) layer may be deposited over the continuous metal layer, and may include oxide-nitride-oxide (ONO) layers and/or high-k materials, for instance. Then, a control gate layer may be deposited over the inter-gate layer, which may be a conductive layer that includes metal (e.g., tungsten or tungsten nitride) or doped polysilicon, for instance. The layers are then patterned to form a gate stack. The resulting device is similar to the device 1400 shown in FIG. 13.

It should be noted that the above described nanodot containing floating gate may be formed in any suitable nonvolatile memory device, such as an EEPROM charge storage transistor having one control gate/one floating gate per channel, or NAND device having plural control gates/plural floating gates per channel between the source and drain regions. For example, the nanodot containing floating gate may be located in any of the devices described in U.S. published application 2011/0020992 A1, published on Jan. 27, 2011 naming Vinod R. Purayath et al. as inventors, the entire contents of which are incorporated herein by reference. Specifically, the nanodot containing floating gate described in one or more of the above-described embodiments may be substituted for the nanostructure coating 328, 426 or 532 of the 2011/0020992 application.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

The preceding description of the disclosed aspects is provided to enable any person skilled in the art to make or use the present invention. Various modifications to these aspects will be readily apparent to those skilled in the art, and the generic principles defined herein may be applied to other aspects without departing from the scope of the invention. Thus, the present invention is not intended to be limited to the aspects shown herein but is to be accorded the widest scope consistent with the principles and novel features disclosed herein.

What is claimed is:

1. A method of fabricating a memory device, comprising:
   coating a first plurality of nanodots over a tunnel dielectric layer;
   curing the first plurality of nanodots using UV curing to attach the nanodots to the tunnel dielectric layer;
   coating a second plurality of nanodots on the tunnel dielectric layer prior to deposition of any permanent dielectric layer over the first plurality of nanodots to form a floating gate layer;
   curing the second plurality of nanodots using UV curing to attach the second plurality of nanodots to the tunnel dielectric layer; and
   depositing a dielectric material over the first plurality of nanodots and the second plurality of nanodots to form a floating gate layer.

2. The method of claim 1, wherein the first plurality of nanodots and the second plurality of nanodots comprise metal nanodots which are coated with a ligand and the tunnel dielectric is located over a channel of a NAND device.

3. The method of claim 2, further comprising:
   performing an additional curing step to remove ligand hydrocarbons prior to depositing the dielectric material.

4. The method of claim 1, further comprising:
   coating a third plurality of nanodots on the tunnel dielectric layer; and
   curing the third plurality of nanodots to attach the third plurality to the tunnel dielectric layer prior to depositing the dielectric material.

5. The method of claim 1, further comprising:
   forming an oxidation barrier layer over the first and second plurality of nanodots.

6. The method of claim 5, wherein the oxidation barrier layer comprises silicon nitride and is formed by either plasma nitridation of the nanodots or deposition of a silicon nitride layer over the nanodots.

7. The method of claim 1, further comprising:
   forming a first oxidation barrier layer over the first plurality of nanodots prior to coating the second plurality of nanodots; and
   forming a second oxidation barrier layer over the first and second plurality of nanodots.

8. The method of claim 7, wherein the first and second oxidation barrier layers comprise silicon nitride and are formed by either plasma nitridation of the nanodots or deposition of a silicon nitride layer over the nanodots.

9. The method of claim 2, further comprising:
   forming a continuous charge storage metal layer over the dielectric material in the floating gate;
   forming a blocking dielectric over the continuous charge storage metal layer; and
   forming a control gate over the blocking dielectric.

10. A method of fabricating a memory device, comprising:
    coating a plurality of nanodots over a tunnel dielectric layer;
    forming an oxidation barrier layer comprising silicon nitride over a surface of the nanodots by plasma nitridation of a surface of the nanodots to form a nitride barrier shell; and
    depositing a dielectric material over the nanodots to form a floating gate layer.

11. The method of claim 10, wherein the plasma nitridation is performed at a temperature in a range of 20-500° C.

12. The method of claim 10, wherein the nanodots comprise metal nanodots which are coated with a ligand.

13. The method of claim 12, wherein the nanodots comprise ruthenium.

14. The method of claim 13, wherein the barrier layer is formed by plasma nitridation of a silicon oxide shell formed on a surface of the ruthenium nanodots by the ligand.

15. The method of claim 10, further comprising:
    forming a continuous metal layer over the dielectric material.

16. The method of claim 10, wherein the oxidation barrier layer is formed with a thickness of less than 3 nm.

17. The method of claim 16, wherein the oxidation barrier layer is formed with a thickness between 1-2 nm.

18. A method of fabricating a memory device, comprising:
    coating a plurality of nanodots over a tunnel dielectric layer;
    forming an oxidation barrier layer over a surface of the nanodots; and
    depositing a dielectric material over the nanodots to form a floating gate layer, wherein the coating step is performed multiple times to increase a density of the nanodots, and a curing step is performed following each of the multiple times the coating step is performed prior to forming the oxidation barrier layer.

19. The method of claim 18, wherein the oxidation barrier layer is formed following a coating and curing of a first plurality of nanodots and prior to a coating and curing of a second plurality of nanodots.

20. The method of claim 19, further comprising forming an oxidation barrier layer on the second plurality of nanodots prior to depositing the dielectric material over the nanodots.

21. The method of claim 18, further comprising:
    forming a continuous metal layer over the dielectric material.

22. The method of claim 18, wherein the oxidation barrier layer is formed with a thickness of less than 3 nm.

23. The method of claim 22, wherein the oxidation barrier layer is formed with a thickness between 1-2 nm.

* * * * *